(12) United States Patent
Aleksov et al.

(10) Patent No.: US 12,550,768 B2
(45) Date of Patent: Feb. 10, 2026

(54) CONFORMAL POWER DELIVERY STRUCTURES NEAR HIGH-SPEED SIGNAL TRACES

(71) Applicant: Intel Corporation, Santa Clara, CA (US)

(72) Inventors: Aleksandar Aleksov, Chandler, AZ (US); Henning Braunisch, Phoenix, AZ (US); Feras Eid, Chandler, AZ (US); Adel Elsherbini, Chandler, AZ (US); Stephen Morein, San Jose, CA (US); Yoshihiro Tomita, Tsukuba (JP); Thomas L. Sounart, Chandler, AZ (US); Johanna Swan, Scottsdale, AZ (US); Brandon M. Rawlings, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 965 days.

(21) Appl. No.: 17/484,299

(22) Filed: Sep. 24, 2021

(65) Prior Publication Data

US 2023/0094979 A1 Mar. 30, 2023

(51) Int. Cl.
*H01L 23/50* (2006.01)
*H01L 23/532* (2006.01)

(52) U.S. Cl.
CPC ........ *H01L 23/50* (2013.01); *H01L 23/53238* (2013.01); *H01L 23/53252* (2013.01); *H01L 23/53266* (2013.01)

(58) Field of Classification Search
CPC .............................. H01L 23/50; H01L 23/586
See application file for complete search history.

(56) References Cited

U.S. PATENT DOCUMENTS

| 5,765,279 | A | * | 6/1998 | Moresco | H01L 21/4857 |
| | | | | | 257/E23.079 |
| 2003/0042044 | A1 | * | 3/2003 | Kirk | H05K 1/162 |
| | | | | | 174/250 |
| 2008/0271779 | A1 | * | 11/2008 | Miller | C23C 14/0089 |
| | | | | | 204/192.12 |
| 2012/0228776 | A1 | * | 9/2012 | Ohno | H01L 24/04 |
| | | | | | 257/773 |
| 2016/0055976 | A1 | * | 2/2016 | Song | H01G 4/12 |
| | | | | | 29/846 |
| 2020/0235082 | A1 | | 7/2020 | Eid et al. | |
| 2021/0242121 | A1 | * | 8/2021 | Park | H01L 23/50 |
| 2021/0398895 | A1 | | 12/2021 | Elsherbini et al. | |
| 2021/0407903 | A1 | | 12/2021 | Elsherbini et al. | |

OTHER PUBLICATIONS

"Cold Spraying;" Wikipedia, as accessed Oct. 28, 2021 at https://en.wikipedia.org/wiki/Cold_spraying, 6 pages.
U.S. Appl. No. 17/484,213, filed Sep. 24, 2021 entitled Conformal Power Delivery Structures.
U.S. Appl. No. 17/484,384, filed Sep. 24, 2021 entitled Cooling of Conformal Power Delivery Structures.

* cited by examiner

*Primary Examiner* — Britt D Hanley
*Assistant Examiner* — Jason James Greaving
(74) *Attorney, Agent, or Firm* — Alliance IP, LLC

(57) ABSTRACT

Technologies for conformal power delivery structures near high-speed signal traces are disclosed. In one embodiment, a dielectric layer may be used to keep a power delivery structure spaced apart from high-speed signal traces, preventing deterioration of signals on the high-speed signal traces due to capacitive coupling to the power delivery structure.

24 Claims, 31 Drawing Sheets

CONFORMAL POWER DELIVERY STRUCTURES NEAR HIGH-SPEED SIGNAL TRACES

BACKGROUND

Power delivery in semiconductor packages is typically done using two or more parallel power planes (e.g., Vcc & Vss, or Vcc1, Vcc2 & Vss1, Vss2). One goal in designing power planes is to have relatively low lateral resistance in the plane to reduce losses and achieve the best possible performance. However, with parallel power planes, at least one of the planes will need to be perforated with through vias to connect the other power plane(s) to a device (e.g., a die in the package). These perforations (which may sometimes be referred to as "anti-pads") can result in lower utilization of the perforated power plane and can increase the effective lateral resistance, in some cases by more than 2× (two times) compared to a solid power plane. While the anti-pads may be made smaller through improved lithography and alignment techniques, these issues may still persist as the anti-pads can only be made so small. For instance, finer lithography techniques may require thinner metal layers, which increase the lateral resistance of the power plane.

DETAILED DESCRIPTION

Aspects of the present disclosure may include a conformal power delivery structure that includes two or more power planes formed on one another. The conformal power delivery structure may include a top/second power plane layer deposited (e.g., via a cold spray deposition process) onto a lower/first power plane layer in such a way the top power plane layer conforms with the shape of the lower power plane layer. Each power plane layer may be separated by and insulated with a thin dielectric material. For instance, the dielectric material layer may be on the order of tens to thousands of nanometers (nm) as opposed to the "anti-pads" used in parallel plane structures that are on the order of approximately 10-100 micrometers (um).

A conformal power delivery structure in accordance with the present disclosure may enable self-aligned, ultra-small anti-pads to achieve better electrical performance than typical parallel power plane structures. For instance, embodiments of the present disclosure may enable much better lateral electrical resistance. Additionally, since there is a relatively thin layer of dielectric between the power planes (as described further below), the lateral inductance may also be significantly improved, helping with transient response characteristics. Furthermore, for on-die power distribution applications (e.g., on-die metal grids or power delivery network on the backside of the die), there may be significant improvements in the thermal conductivity when compared to standard manufacturing techniques, which can improve the thermal spreading performance. In some cases, the same number of power planes may also be implemented in less volume than a traditional parallel power plane structure.

In some embodiments, a high-speed signal trace may be near a conformal power delivery structure. In order to prevent an undesirable influence from the conformal power delivery structure on the high-speed signal trace, a dielectric is positioned around the signal trace to separate it from the conformal power delivery structure. A buffer layer around the dielectric protects it during a cold spray process that is used to create the conformal power delivery structure.

Figure 1:
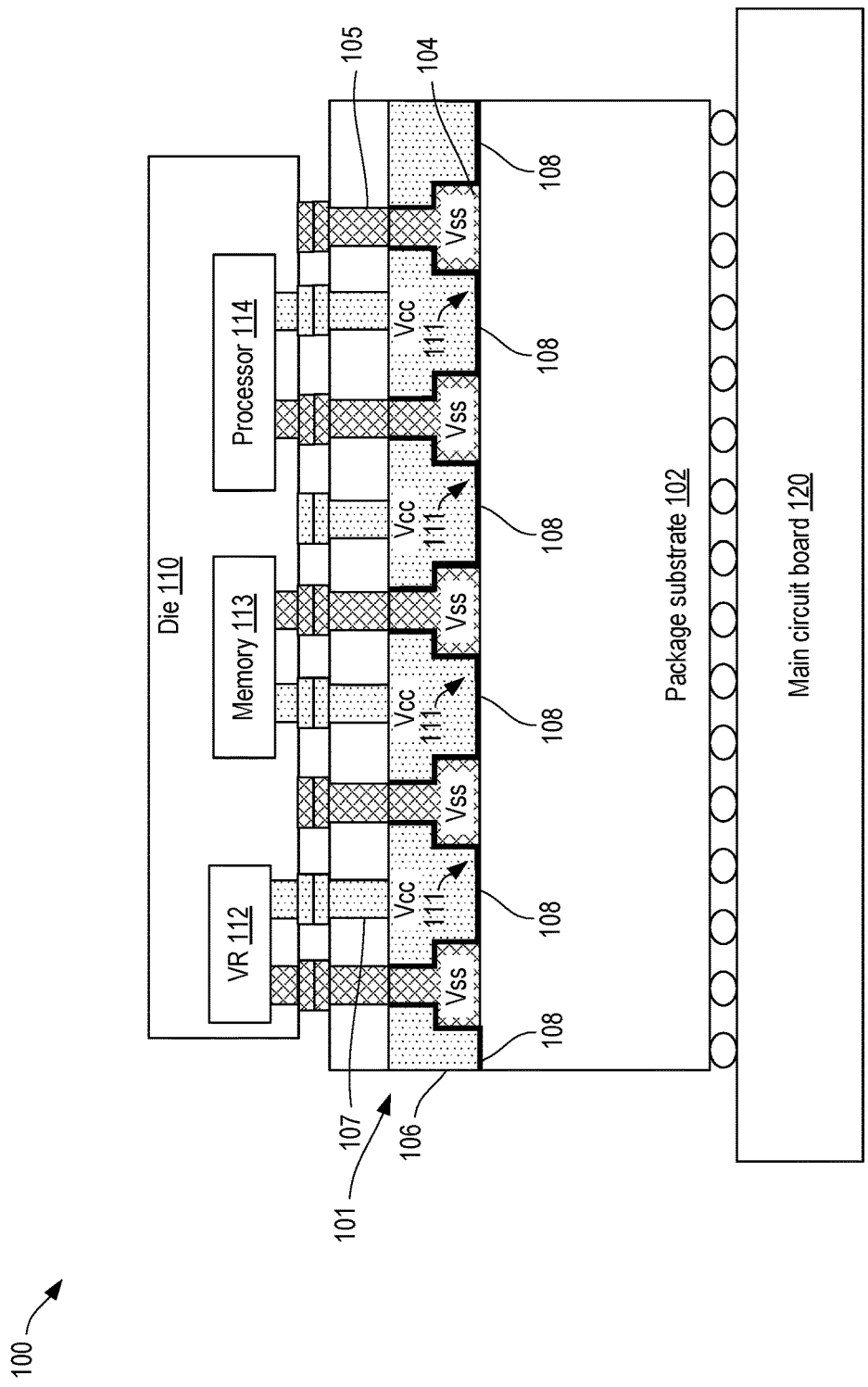
FIG. 1 illustrates an example system that includes a conformal power delivery structure in accordance with embodiments of the present disclosure.

FIG. 1 illustrates an example system 100 that includes a conformal power delivery structure 101 in accordance with embodiments of the present disclosure. In particular, the example system 100 includes the conformal power delivery structure 101 inside a package substrate 102, which is connected to a main board 120 (e.g., a system motherboard or similar type of circuit board). The conformal power delivery structure 101 includes a first power plane 104 and a second power plane 106 formed on the first power plane 104, with a dielectric layer 108 between the first power plane 104 and second power plane 106. The conformal power delivery structure 101 may be formed as described further below with respect to FIG. 3, or in another manner.

As shown, the first power plane 104 of the conformal power delivery structure 101 is defined by a first electrically conductive layer (e.g., metal or a material comprising metal) that has a non-flat upper surface that defines one or more recesses 111, and the second power plane 106 is defined by a second electrically conductive layer (e.g., metal or a material comprising metal) that is within the recesses 111 such that the lower surface of the second electrically conductive layer generally conforms with the non-flat upper surface of the first electrically conductive layer and the planes 104, 106 are co-planer with one another within the areas of the recesses 111.

As used herein, a first surface generally conforming to a second surface may refer to the first surface having the same or very similar shape as the first surface, with the first surface following along the surface of the second surface. For instance, in the example shown, the lower surface of the plane 106 (the surface facing the plane 104 and the lower part of the substrate 102) has the same shape as the upper surface of the plane 104 (the surface facing the plane 106 and the upper part of the substrate 102). Thus, the dielectric layer 108 between the planes 104, 106 has the same shape as the upper surface of plane 104 and lower surface of plane 106. However, in some embodiments, due to manufacturing differences, tolerances, dielectric (or other layer) deposition methods, the conforming surfaces may not have the exact same shape as one another, but they may still be considered to be conforming in the sense that the lower surface of the upper plane 106 generally follows along with the surface of the upper surface of the plane 104 (and/or the dielectric layer 108 to the extent it's shape is slightly different from that of the upper surface of the plane 104).

The second power plane 106 defines openings in its upper surface (which is flat in the example shown) in which the upper portions of the first power plane 104 are disposed. For instance, in some embodiments, the conformal power delivery structure 101 may be formed similar to the conformal power delivery structure 500 of FIG. 5. Although shown as having the dielectric layer 108 being within the recesses 111, in some embodiments, the dielectric layer 108 in the areas of the recesses 111 may be removed so that the upper power plane may be accessed by lower layers of the package substrate 102.

As used herein, the terms "upper"/"lower" or "above"/"below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

In the example shown, the conformal power delivery structure 101 allows for power delivery to component circuitry of a die 110, which may include one or more of voltage regulator circuitry 112, memory circuitry 113, and/or processor circuitry 114. In some instances, the die 110 may include only one type of circuitry thereon. In other instances, each of the different circuitries may be housed in a separate die instead of one die as shown. In some embodiments, the die 110 may be implemented as a die stack, or may be implemented as several different dies on an organic or inorganic interposer apparatus (e.g., with each die comprising different circuitry).

The power delivery to the die 110 is in two planes (e.g., Vss and Vcc, in the example shown) through the vias 105, 107 and electrical connectors on the exterior surface of the package substrate 102 and the die 110 (e.g., the pads shown in FIG. 1). In particular, power from the first power plane 104 is delivered through vias 105 which connect to the first power plane 104 via the openings in the second power plane 106, and power from the second power plane 106 is delivered through vias 107 that connect to the upper surface of the second power plane 106. In some cases, the die 110 may include voltage regulator circuitry (e.g., as VR 112 or as circuitry inside the processor 114) to convert and/or regulate the voltages provided by the first and second power planes of the conformal power delivery structure 101.

Figure 2:
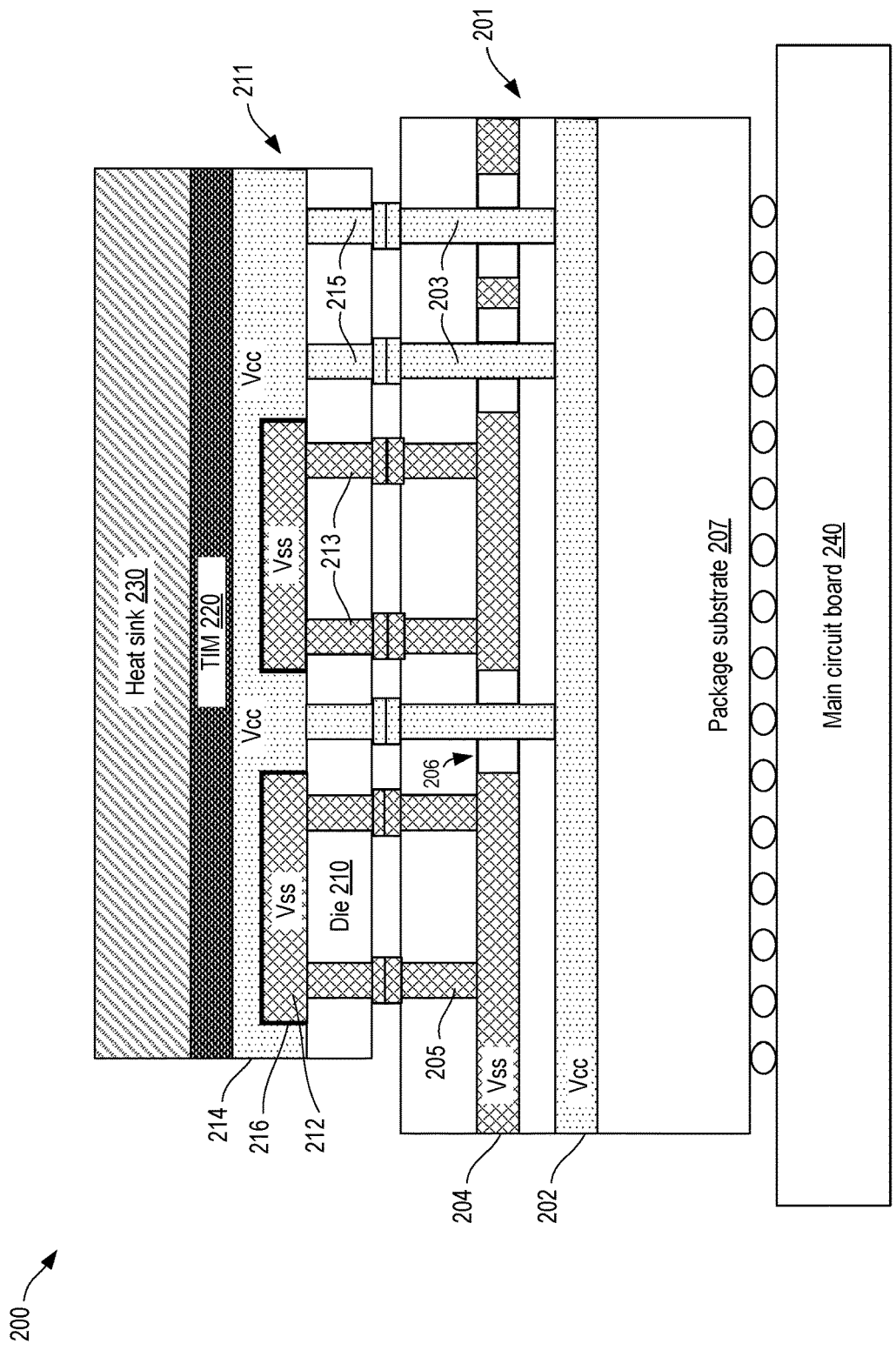
FIG. 2 illustrates an example system that includes a conformal power delivery structure on the backside of an integrated circuit die in accordance with embodiments of the present disclosure.
Figure 9:
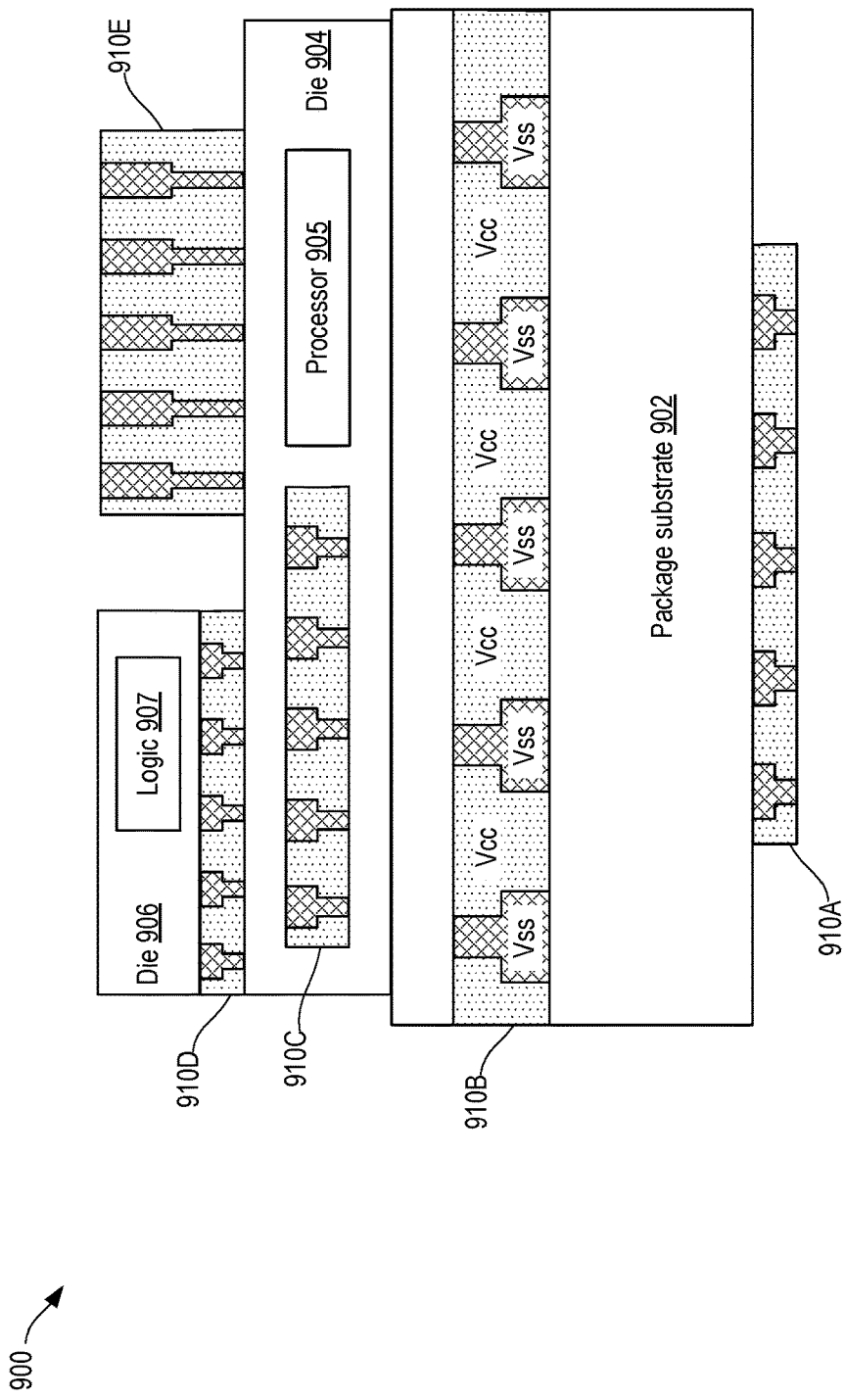
FIG. 9 illustrates a number of conformal power delivery structures in various areas of a chip package.

Although described herein as being power "planes", it will be understood that the power planes of the present disclosure may not be planar in the geometric sense (e.g., completely flat in one plane like traditional power planes). In addition, although shown as formed in a particular way (e.g., with two power planes), the conformal power delivery structure 101 may be formed in any suitable manner in accordance with the examples described herein (e.g., with three or more power planes, or with different via shapes, or no vias). Further, although shown as being located in a package substrate 102, the conformal power delivery structure 101 may be included in any suitable location within a package (e.g., as shown in FIG. 9 and described further below). As one example, the conformal power delivery structure 101 may be used to distribute power on the backside of a die, or a die stack as shown in FIG. 2. The power planes may also be used to deliver power from one die to another die on the same package (e.g., from a separate voltage regulator die to a processor die) or from outside the package (main board, battery, etc.) to the package and then to the die(s).

FIG. 2 illustrates an example system 200 that includes a conformal power delivery structure 211 on the backside of an integrated circuit die 210 in accordance with embodiments of the present disclosure. As used herein, the "backside" may refer to the side or surface of a die that is opposite of, or intended to be positioned opposite of, a package substrate. For instance, in the example shown in FIG. 2, the conformal power delivery structure 211 is on the opposite side of the die 210 than the side of the die 210 that is to interface with the package substrate 207 (e.g., through pads as shown). Although not shown in FIG. 2, the die 210 may further include circuitry similar to the die 110 of FIG. 1, such as for example, voltage regulator circuitry, memory circuitry, and/or logic circuitry, e.g., a field programmable gate array (FPGA), application-specific integrated circuit (ASIC), central processor unit (CPU) circuitry, graphics processing unit (GPU) circuitry, or other types of digital logic circuitry. Further, the die 210 may be more complex than illustrated in some embodiments. For example, the die 210 may be implemented as a die stack in some embodiments or may be implemented as several different dies on an organic or inorganic interposer apparatus.

The example system 200 includes a package substrate 207 on a main circuit board 240 (e.g., a motherboard), with an integrated circuit die 210 on the package substrate 207. The package substrate 207 has a parallel power plane structure 201 formed therein; however, in other embodiments, the package substrate 207 may include a conformal power delivery structure as described herein (e.g., as shown in FIG. 1). The parallel power plane structure 201 includes a first plane 202 and a second plane 204 separated by a layer of dielectric (e.g., the same material as the substrate 207) and in parallel with one another. The second power plane 204 includes anti-pads 206 that allow vias (e.g., 203) connected to the first power plane 202 to pass through the second power plane and connect to the die 210 or other components. In some embodiments, the conformal power delivery structure may be formed similar to the conformal power delivery structure 600 of FIG. 6.

The first and second power plane are connected to third and fourth power planes 212, 214 of the conformal power delivery structure 211 on the backside of the die 210. For instance, the first power plane 202 (Vcc) is connected to the fourth power plane 214 through vias 203 in the package substrate and vias 215 in the die 210 (which are in turn connected together via pads on the exterior surfaces of the package substrate 207 and die 210 as shown), and the second power plane 204 (Vss) is connected to the third power plane 212 through vias 205 in the package substrate and vias 213 in the die 210 (which are also connected together via pads on the exterior surfaces of the package substrate 207 and die 210 as shown). The third and fourth power planes 212, 214 of the conformal power delivery structure 211 are separated by a dielectric layer 216.

The example system 200 also includes a thermal interface material (TIM) 220 formed on the fourth power plane 214, and a heat sink 230 formed on the TIM 220. The TIM 220 and heat sink 230 may act to dissipate heat from the die 210 in certain instances.

Figure 3:
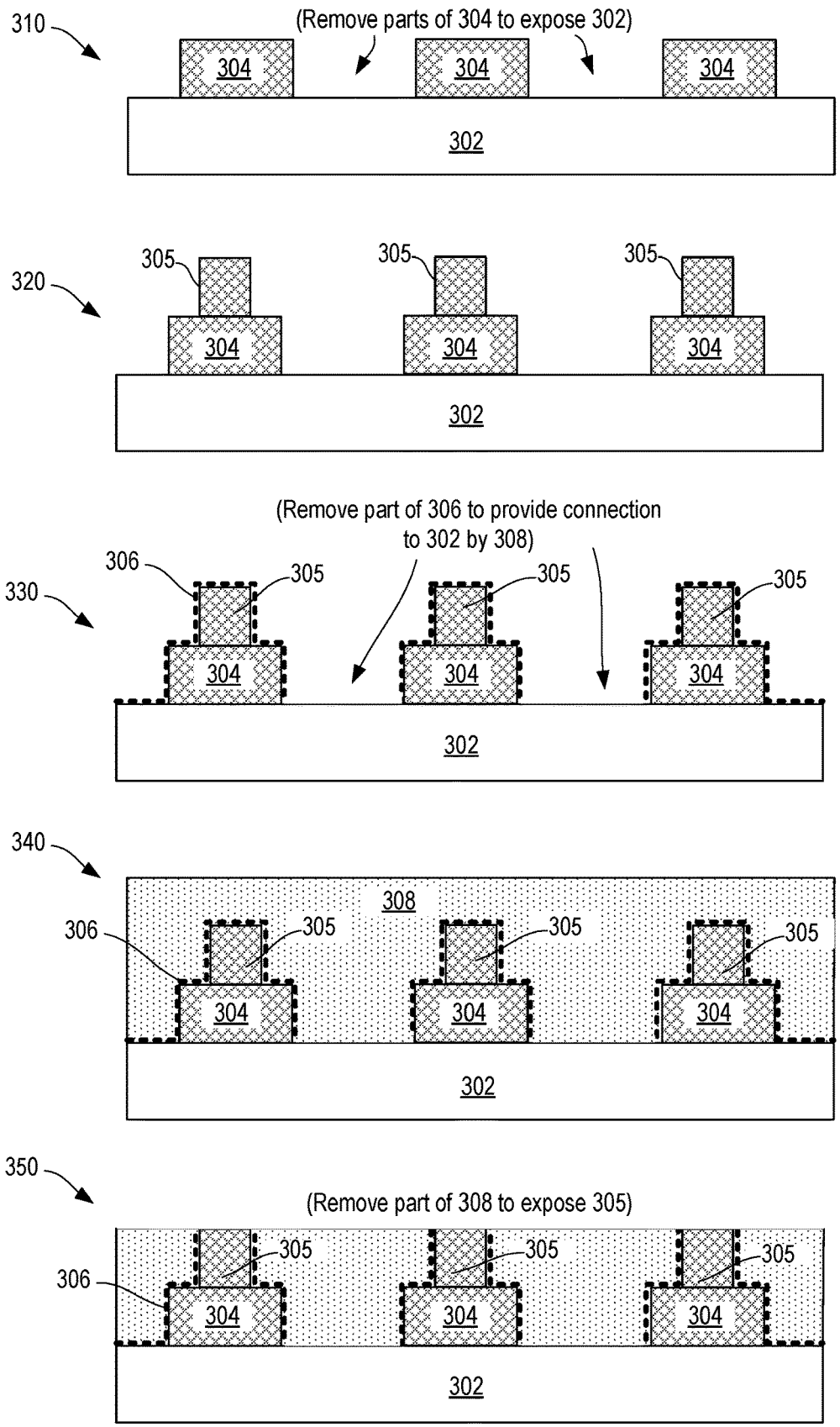
FIG. 3 illustrates an example process for manufacturing a conformal power delivery structure with two power planes in accordance with embodiments of the present disclosure.

FIG. 3 illustrates an example process 300 for manufacturing a conformal power delivery structure with two power planes in accordance with embodiments of the present disclosure. The example process 300 is a simplified process and illustrates only certain steps that may be performed for manufacturing a conformal power delivery structure in accordance with the present disclosure. In some cases, the process 300 may include fewer, additional, or different operations/steps than those illustrated and described below.

At 310, a metal layer 304 is deposited on a substrate 302. The substrate may be a printed circuit board (PCB), wafer, package, etc., and the metal layer 304 may be any suitable conducting metal, such as, for example, copper, aluminum, titanium, etc. The metal layer 304 may be deposited using electroplating, subtractive etching, or high-throughput additive manufacturing (HTAM). The metal layer 304 may serve as a first power plane of the conformal power delivery structure. The metal layer 304 may be etched or otherwise reduced in certain areas down to the substrate 302, as shown in 310.

At 320, metal protrusions 305 are formed over the base metal layer 304. These metal protrusions 305 may be optional in certain cases, e.g., depending on the architecture, and may be formed using a second lithography step and electroplating, or through additive manufacturing. The metal protrusions 305 may act as through connections (via equivalents) to enable connecting the bottom power grid to the top side of the conformal power delivery structure, i.e., through the second power plane.

At 330, a thin dielectric layer 306 is deposited over the substrate 302, metal layer portions 304 and metal protrusions 305. The dielectric layer 306 serves as the electrical insulation between the layers of the conformal power delivery structure, and in some cases, may provide useful capacitance. The dielectric layer 306 may be formed using an organic dielectric material, such as, for example, silica filled epoxy or an inorganic dielectric material such as Si3N4, SiCN, TiO2, HfO2, SiO2, AlN, AO2O3 or other similar materials. In some cases, thin dielectric layer 306 may be capped with a thin metal layer stack, such as, for example, titanium and copper, to enable the following step additional patterning, e.g., if connections to the base substrate 302 are needed for the metal layer 308. For instance, an additional patterning or laser ablation step may be performed to remove the thin dielectric layer in certain locations.

At 340, another metal layer 308 is deposited over the thin dielectric layer 306. The metal layer 308 forms the second power plane of the conformal power delivery structure. The metal layer 308 may be deposited via a cold spray process, e.g., blanket deposited if it is a common layer (e.g., a Vss plane common to the whole design) or maybe patterned through HTAM patterning or lithographic patterning if it is not a common layer (e.g., a Vcc power plane). The deposited metal layer 308 may be a pure metal (e.g., copper, aluminum, etc.) or a composite (e.g., copper with diamond or silica fillers) e.g., for improved mechanical and/or thermal performance.

At 350, the metal layer 308 is partially removed (e.g., ground down, fly cut, or chemical mechanical polished) to reveal the through connections provided by the metal protrusions 305. This may be performed, e.g., where connections are needed to the bottom power plane from the top side.

Figure 4:
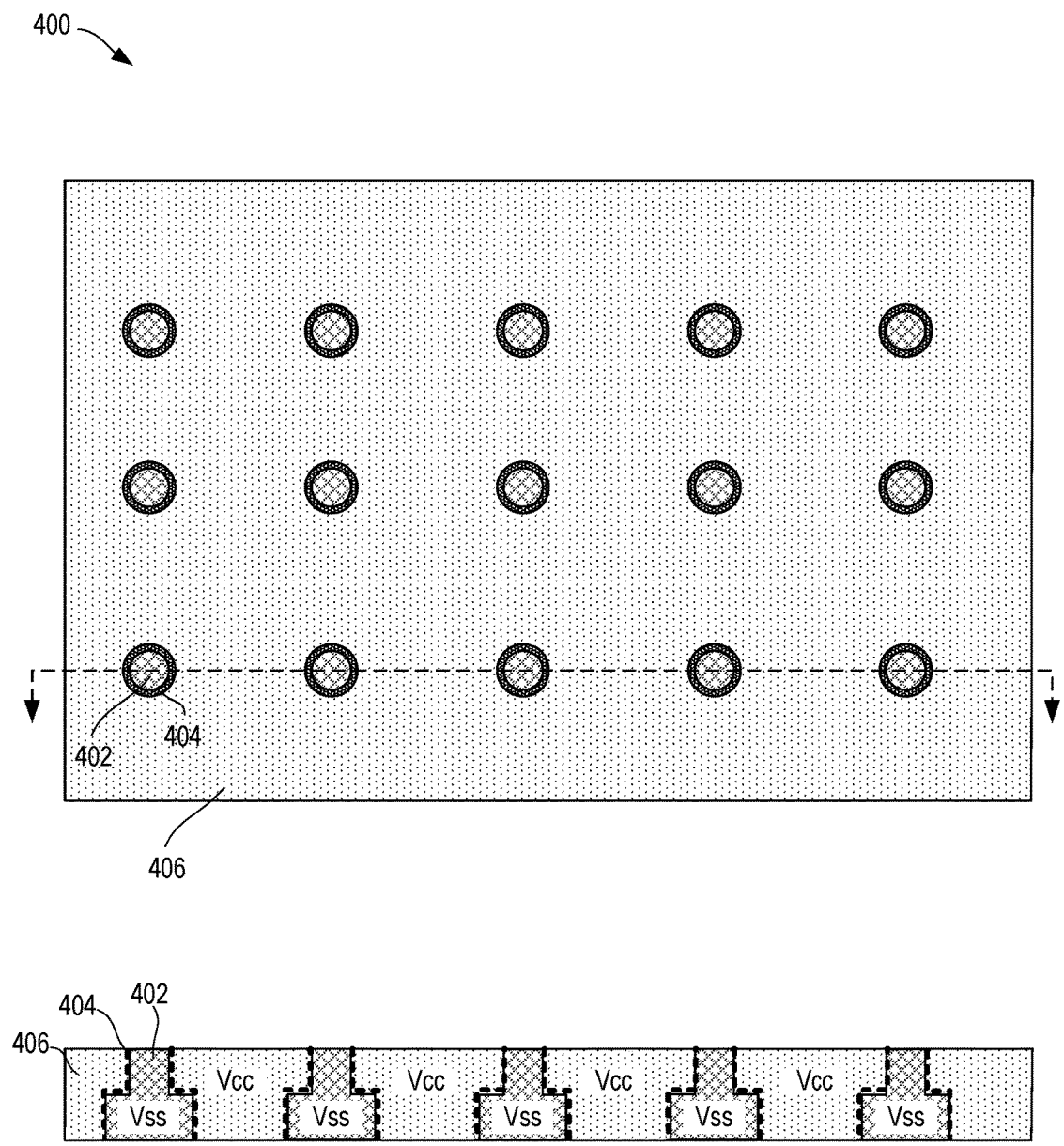
FIG. 4 illustrates an example conformal power delivery structure that may be formed using the process of FIG. 3.

FIG. 4 illustrates an example conformal power delivery structure 400 that may be formed using the process 300 of FIG. 3. In particular, FIG. 4 illustrates a top view of the conformal power delivery structure 400 and a side/cross-sectional view of the conformal power delivery structure 400. The conformal power delivery structure 400 includes a first power plane 402 and second power plane 406 formed on the first power plane 402, e.g., as described above. The power planes 402, 406 are separated by a thin dielectric material layer 404. As may be seen from the top view of the conformal power delivery structure 400, the size of the anti-pad created by the thin dielectric layer 404 may be quite smaller than the anti-pads required by traditional parallel power plane structures, e.g., an order(s) of magnitude smaller, potentially providing one or more advantages as described above.

Figure 5:
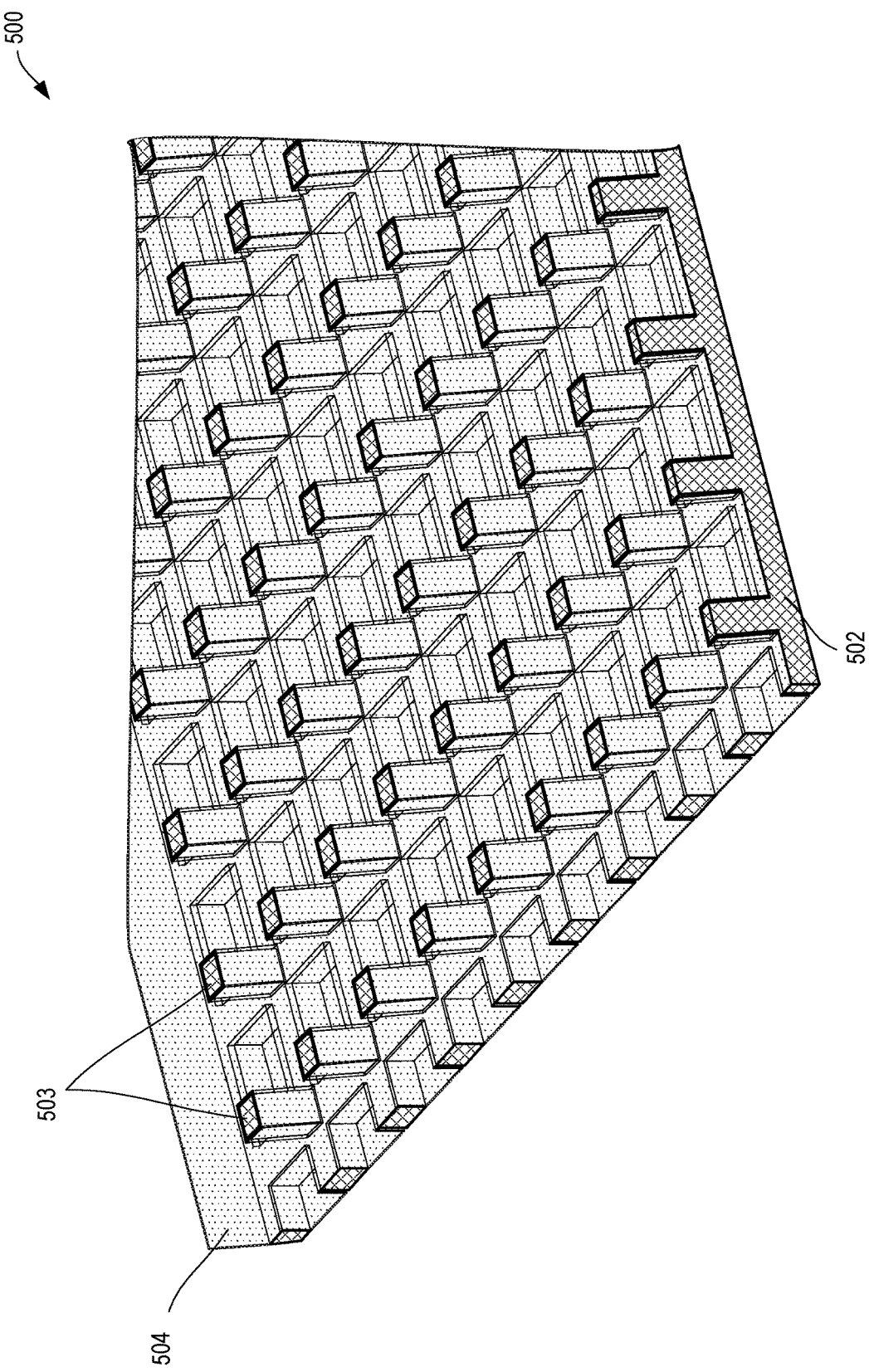
FIGS. 5 and 6 illustrate perspective views of example conformal power delivery structures in accordance with embodiments of the present disclosure.
Figure 6:
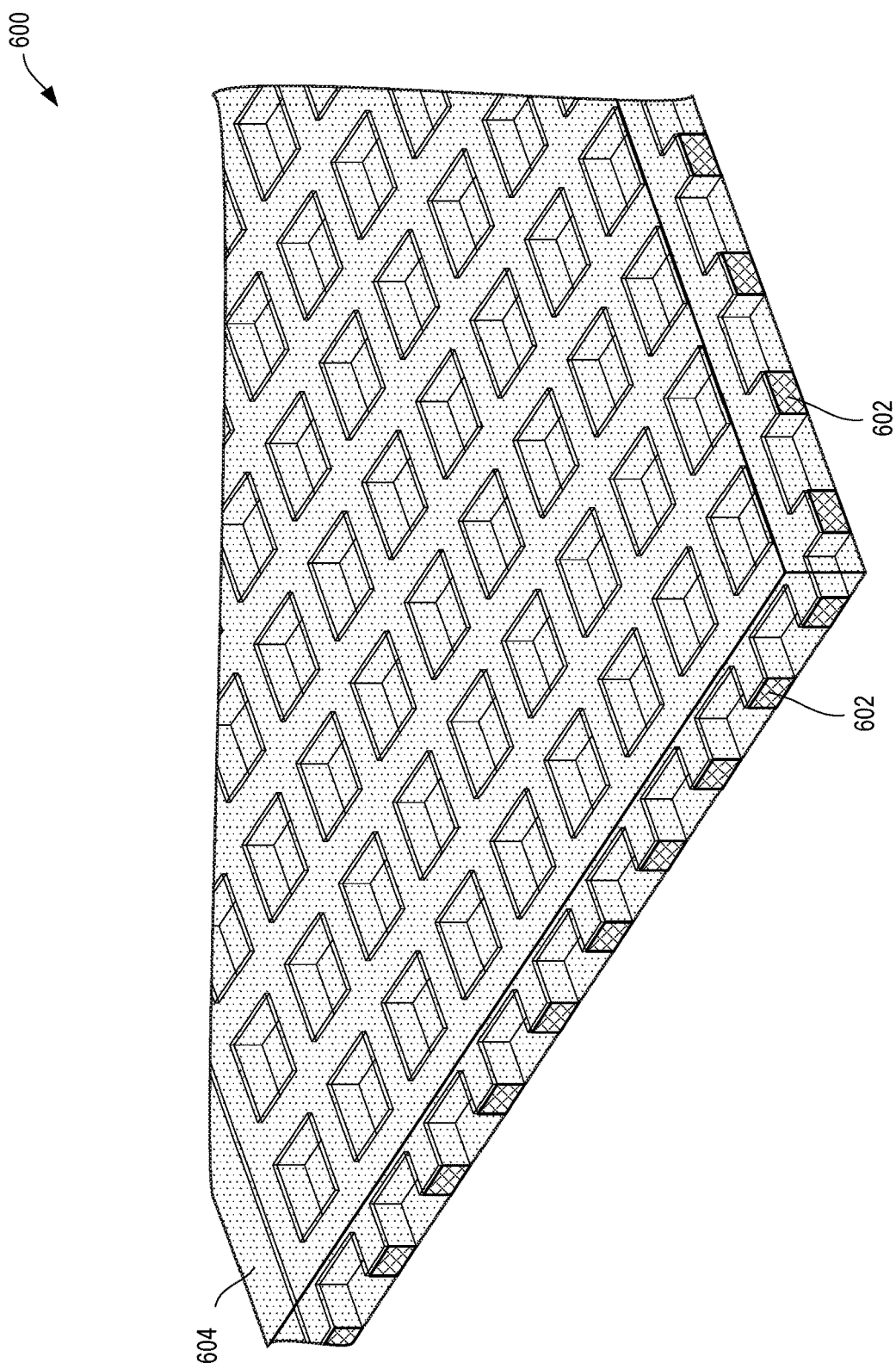

FIGS. 5 and 6 illustrate perspective views of example conformal power delivery structures in accordance with embodiments of the present disclosure. In the example shown in FIG. 5, the conformal power delivery structure 500 includes a bottom power plane 502 and top power plane 504 separated by a dielectric layer. The conformal power delivery structure 500 also includes a number of protrusions/through connections 503 to allow the bottom power plane 502 to connect to a device that may be placed on the top surface of the top power plane 504 (e.g., a die, package substrate, or any other suitable connecting device or apparatus). In the example shown in FIG. 6, the conformal power delivery structure 600 includes a bottom power plane 602 and top power plane 604 separated by a dielectric layer. However, in the example shown in FIG. 6, there are no through connections going from the bottom power plane 602 to the top surface of the top power plane 604 as in FIG. 5.

Figure 7:
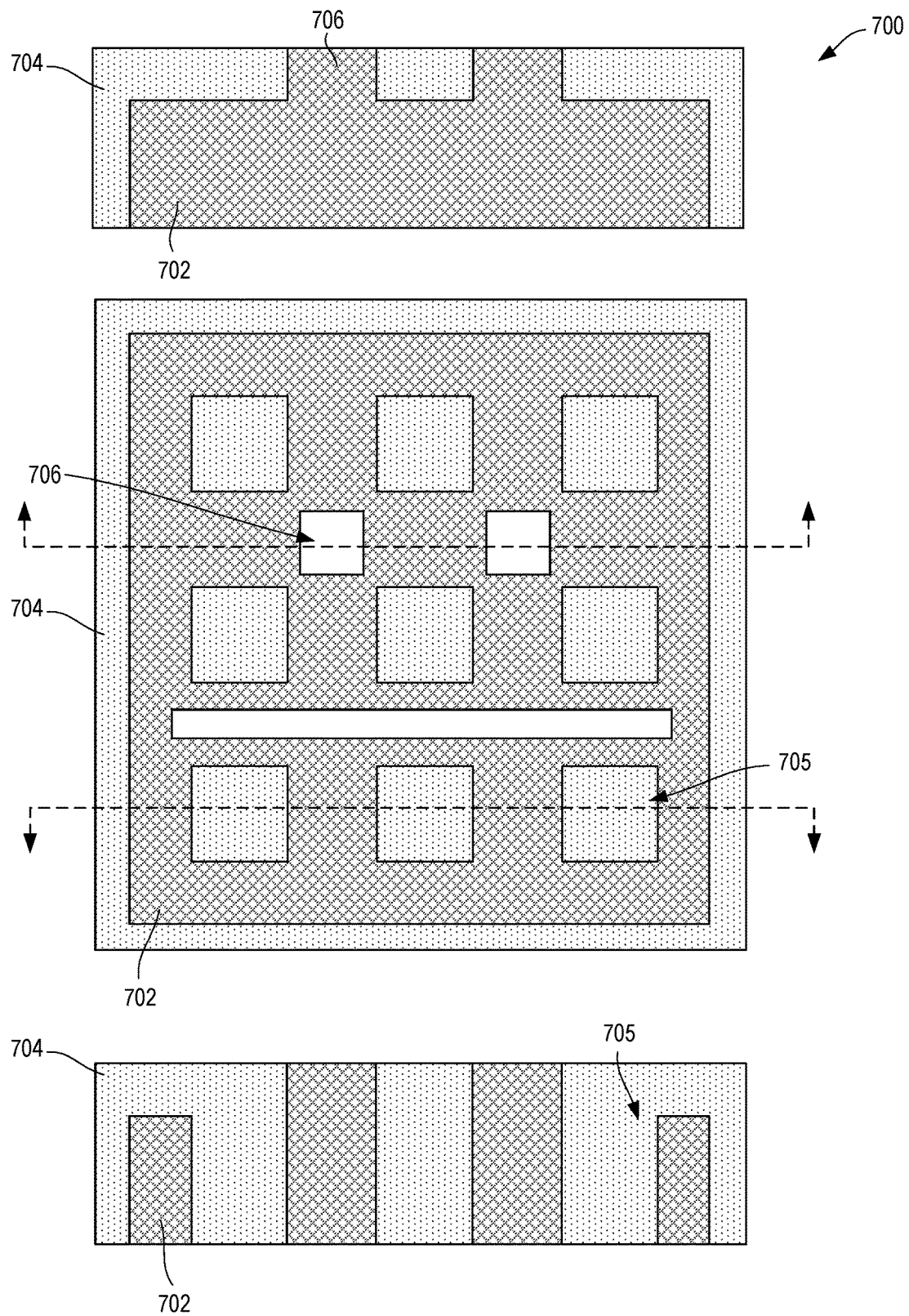
FIGS. 7 and 8 illustrate other example conformal power delivery structures in accordance with embodiments of the present disclosure.
Figure 8:
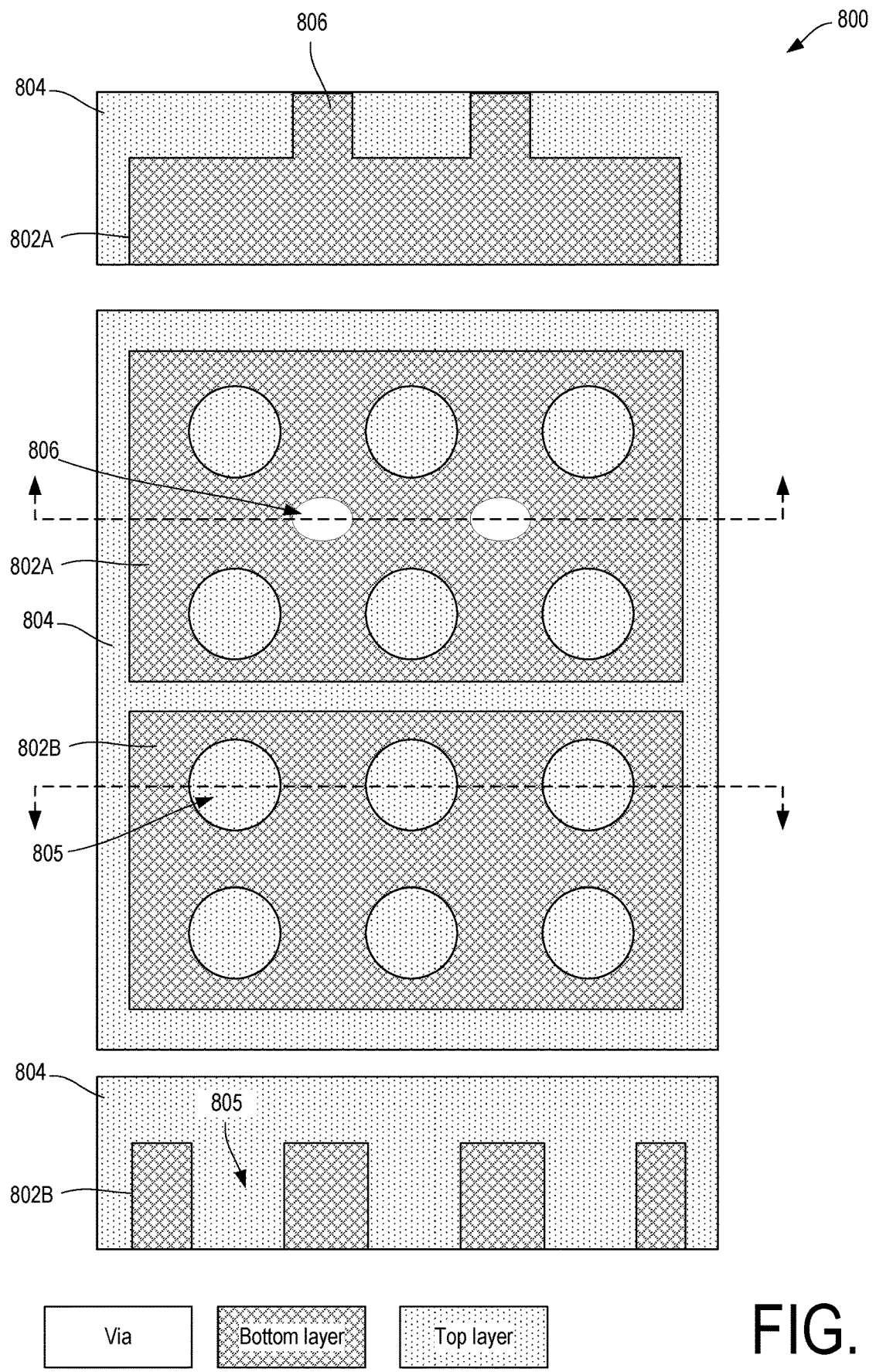

In the examples shown in FIGS. 5-6, the power planes form rectangular shapes which conform with one another. That is, the bottom power planes 502, 602 are formed with rectangular etched areas (and protrusions 503) in which the top power planes 504, 604 are formed. However, the etched areas and/or protrusions may be formed with other shapes. FIGS. 7-8 illustrate other examples shapes for such areas of a conformal power delivery structure.

FIGS. 7 and 8 illustrate other example conformal power delivery structures 700, 800 in accordance with embodiments of the present disclosure. In particular, FIG. 7 illustrates a top view and two cross-sectional views of an example conformal power delivery structure 700 with rectangular and square-shaped vias (e.g., 706). As shown in FIG. 7, the conformal power delivery structure 700 includes a bottom power plane layer 702 and a top power plane layer 704 formed over the bottom power plane layer 702. The conformal power delivery structure 700 also includes vias (e.g., 706) from the bottom power plane layer 702 through the top power plane layer 704, allowing the bottom power plane layer 702 to be accessed by a device or other structure positioned above the top power plane layer 704. In the example shown in FIG. 7, etched areas (e.g., 705) in the bottom power plane layer 702 form holes in the bottom power plane layer 702 that allow the top power plane layer 704 to be accessed by a device or other structure positioned below the conformal power delivery structure 700. The etched areas in the example conformal power delivery structure 700 are formed in a square shape; however, the etched areas may be formed in other shapes than those shown in FIG. 7, such as in a circular, rectangular, or oval-shaped manner.

FIG. 8 illustrates a top view and two cross-sectional views of an example conformal power delivery structure 800 with oval-shaped vias (e.g., 806). As shown in FIG. 8, the conformal power delivery structure 800 includes two bottom power plane layers 802A, 802B and a top power plane layer 804 formed over the bottom power plane layers 802. The conformal power delivery structure 800 also includes vias (e.g., 806) from the bottom power plane layer 802 through the top power plane layer 804, allowing the bottom power plane layer 802 to be accessed by a device or other structure positioned above the top power plane layer 804. In the example shown in FIG. 8, etched areas (e.g., 805) form holes in the bottom power plane layer 802 that allow the top power plane layer 804 to be accessed by a device or other structure positioned below the conformal power delivery structure 800. The etched areas in the example conformal power delivery structure 800 are formed in a circular shape; however, the etched areas may be formed in other shapes than those shown, such as in a rectangular, oval-shaped, or square-shaped manner. In the example shown, the conformal power delivery structure 800 effectively splits the bottom power plane layer 802 into two separate power planes 802A, 802B, which may be advantageous in certain embodiments.

FIG. 9 illustrates a number of conformal power delivery structures 910 in various areas of a chip package 900. As shown in FIG. 9, conformal power delivery structures in accordance with the present disclosure may be placed in a number of different locations within a chip package, with the possibility of multiple implementations being used in the same package and/or for delivering power to the same circuit. For instance, the example chip package 900 includes a first conformal power delivery structure 910A placed below a package substrate 902 of the chip package 900, a second conformal power delivery structure 910B within the package substate 902 (e.g., as shown in FIG. 1), a third conformal power delivery structure 910C within a die 904, a fourth conformal power delivery structure 910D formed on the underside of the die 906 (potentially allowing for connections with the conformal power delivery structure 910C of the die 904), and a fifth conformal power delivery structure 910E for use as an interposer with another device or apparatus to be positioned above the chip package 900.

Figure 10:
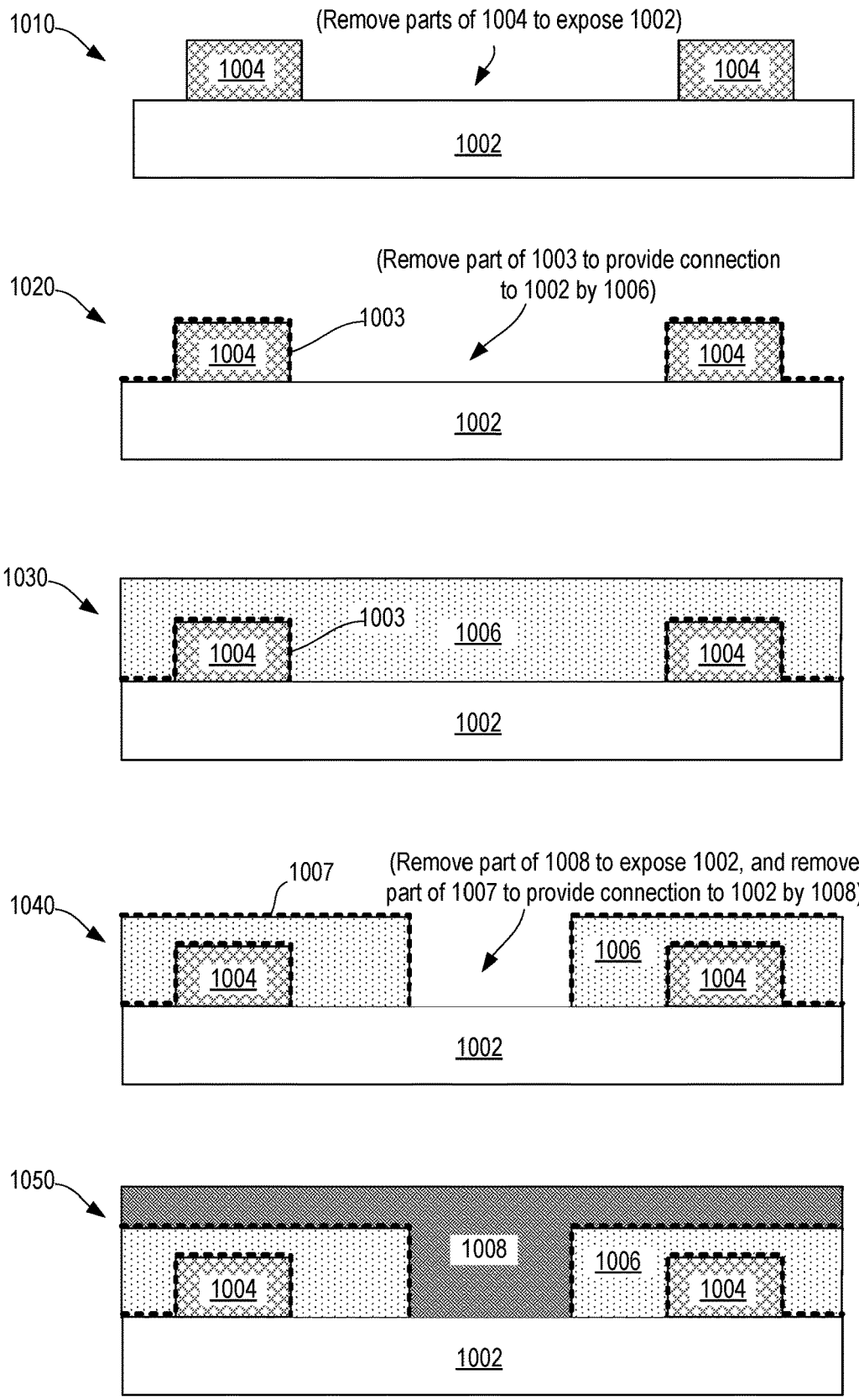
FIG. 10 illustrates an example process for manufacturing a conformal power delivery structure with three power planes in accordance with embodiments of the present disclosure.

FIG. 10 illustrates an example process for manufacturing a conformal power delivery structure with three power planes in accordance with embodiments of the present disclosure. The example process 1000 is a simplified process and illustrates only certain steps that may be performed for manufacturing a conformal power delivery structure in accordance with the present disclosure. In some cases, the process 1000 may include fewer, additional, or different operations/steps than those illustrated and described below. It will be seen in FIG. 10, that the process 1000 may produce a conformal power delivery structure with access to all three power planes at the bottom side of the structure, i.e., at the substrate 1002 in the example shown. Though not shown, the substrate 1002 may include one or more connections (e.g., pads, lines, etc.) to connect to each of the power planes of the conformal power delivery structure.

At 1010, a metal layer 1004 is deposited on a substrate 1002. The substrate may be a printed circuit board (PCB), wafer, package, etc., and the metal layer 1004 may be any suitable conducting metal, such as, for example, copper, aluminum, titanium, etc. The metal layer 1004 may be deposited using electroplating or high-throughput additive manufacturing (HTAM). The metal layer 1004 may serve as a first power plane of the conformal power delivery structure. The metal layer 1004 may be etched or otherwise reduced in certain areas down to the substrate 1002, as shown in 1010.

At 1020, a thin dielectric layer 1003 is deposited over the exposed portions of the substrate 1002 and remaining metal layer portions 1004. The dielectric layer 1003 serves as the electrical insulation between layers of the conformal power delivery structure, and in some cases, may provide useful capacitance. The dielectric layer 1003 may be formed using an organic dielectric material, such as, for example, silica filled epoxy or inorganic dielectric such as $Si_3N_4$, $TiO_2$, $HfO_2$, $SiCN$, $SiO_2$, $AlN$, $Al_2O_3$ or other similar materials or combinations of different layers (e.g., as a barrier or improved capacitor electrodes). In some cases, thin dielectric layer 1003 may be capped with a thin metal layer stack, such as, for example, titanium and copper, to enable the following step additional patterning, e.g., if connections to the base substrate 1002 are needed for the metal layer 1006. In addition, at 1020, an additional patterning or laser ablation step is performed to remove the thin dielectric layer in certain locations to expose the substrate.

At 1020, a second metal layer 1006 is deposited over the thin dielectric layer 1003 and exposed portions of the substrate 1002. The metal layer 1006 forms the second power plane of the conformal power delivery structure. The metal layer 1006 may be blanket deposited if it is a common layer or maybe patterned through HTAM patterning or lithographic patterning if it is not a common layer. The deposited metal layer 1006 may be a pure metal (e.g., copper, aluminum, etc.) or a composite (e.g., copper with diamond or silica fillers) e.g., for improved mechanical and/or thermal performance.

At 1040, one or more portions of the metal layer 1006 are partially removed (e.g., etched) to expose the substrate 1002 below. In addition, a second dielectric layer 1007 is deposited on the remaining portions of the second metal layer 1006 and the exposed portions of the substrate 1002, and then, one or more portions of the second dielectric layer 1007 are removed to expose portion(s) the substrate again.

At 1050, a third metal layer 1008 is deposited over the remaining portions of the dielectric layer 1007 and exposed portions of the substrate 1002. The metal layer 1008 forms the third power plane of the conformal power delivery structure. The metal layer 1008 may be blanket deposited if it is a common layer or maybe patterned through HTAM patterning or lithographic patterning if it is not a common layer. The deposited metal layer 1008 may be a pure metal (e.g., copper, aluminum, etc.) or a composite (e.g., copper with diamond or silica fillers) e.g., for improved mechanical and/or thermal performance.

Figure 11:
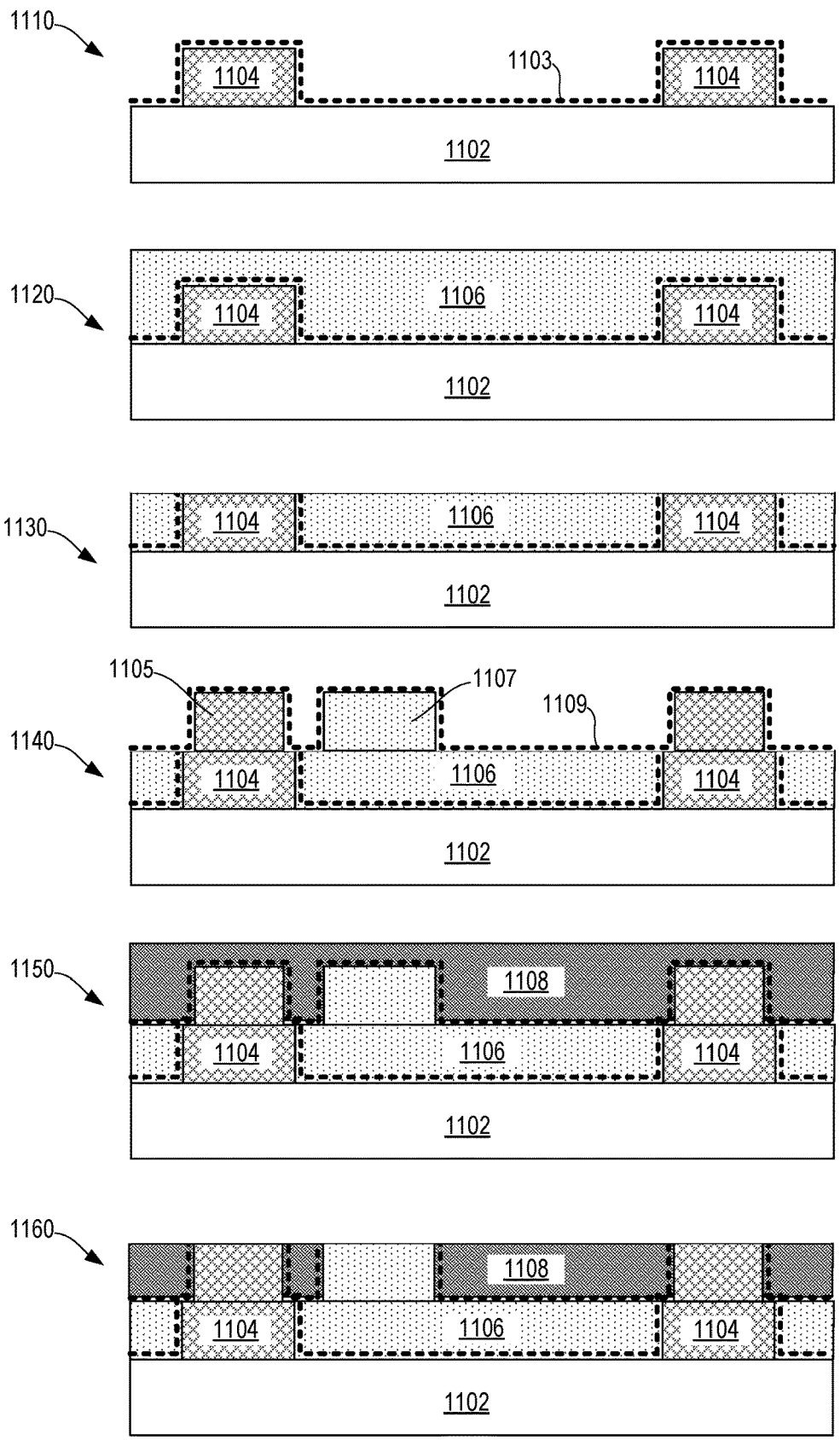
FIG. 11 illustrates another example process for manufacturing a conformal power delivery structure with three power planes in accordance with embodiments of the present disclosure.

FIG. 11 illustrates an example process 1100 for manufacturing a conformal power delivery structure with three power planes in accordance with embodiments of the present disclosure. The example process 1100 is a simplified process and illustrates only certain steps that may be performed for manufacturing a conformal power delivery structure in accordance with the present disclosure. In some cases, the process 1100 may include fewer, additional, or different operations/steps than those illustrated and described below. It will be seen in FIG. 11, that the process 1100 may produce a conformal power delivery structure with access to all three power planes at the top side of the structure, i.e., on the opposite side of the substrate 1102 in the example shown.

At 1110, a metal layer 1104 is deposited on a substrate 1102. The substrate may be a printed circuit board (PCB), wafer, package, etc., and the metal layer 1104 may be any suitable conducting metal, such as, for example, copper, aluminum, titanium, etc. The metal layer 1104 may be deposited using electroplating or high-throughput additive manufacturing (HTAM). The metal layer 1104 may serve as a first power plane of the conformal power delivery structure. The metal layer 1104 may be etched or otherwise reduced in certain areas down to the substrate 1102, as shown in 1110.

Further, at 1110, a thin dielectric layer 1103 is deposited over the substrate 1102 and remaining metal layer portions 1104. The dielectric layer 1103 serves as the electrical insulation between layers of the conformal power delivery structure, and in some cases, may provide useful capacitance. The dielectric layer 1103 may be formed using an organic dielectric material, such as, for example, silica filled epoxy or inorganic dielectric such as SiN, SiCN, $SiO_2$, AlN, $Al_2O_3$ or other similar materials. In some cases, thin dielectric layer 1103 may be capped with a thin metal layer stack, such as, for example, titanium and copper, to enable the following step additional patterning, e.g., if connections to the base substrate 1102 are needed for the metal layer 1106. For instance, an additional patterning or laser ablation step may be performed to remove the thin dielectric layer in certain locations.

At 1120, a second metal layer 1106 is deposited over the thin dielectric layer 1103. The metal layer 1106 forms the second power plane of the conformal power delivery structure. The metal layer 1106 may be blanket deposited if it is a common layer or maybe patterned through HTAM patterning or lithographic patterning if it is not a common layer. The deposited metal layer 1106 may be a pure metal (e.g., copper, aluminum, etc.) or a composite (e.g., copper with diamond or silica fillers) e.g., for improved mechanical and/or thermal performance.

At 1130, the metal layer 1106 is partially removed (e.g., ground down, fly cut, or chemical mechanical polished) to expose the metal layer 1104.

At 1140, metal protrusions 1105 and 1107 are formed over the base metal layer 1104 and metal layer 1106, respectively. The metal protrusions may be formed using a second lithography step and electroplating, and may act as through connections (via equivalents) to enable connecting the power grids related to 1104, 1106 to the top side of the conformal power delivery structure. Further, another thin dielectric layer 1109 is formed on top of the structure as shown. The dielectric layer 1109 may be a similar material, or the same material, as the thin dielectric layer 1103.

At 1150, a third metal layer 1108 is deposited over the thin dielectric layer 1109. The metal layer 1108 forms the third power plane of the conformal power delivery structure. The metal layer 1108 may be blanket deposited if it is a common layer or maybe patterned through HTAM patterning or lithographic patterning if it is not a common layer. The deposited metal layer 1108 may be a pure metal (e.g., copper, aluminum, etc.) or a composite (e.g., copper with diamond or silica fillers) e.g., for improved mechanical and/or thermal performance.

At 1160, the metal layer 1108 is partially removed (e.g., ground down, fly cut, or chemical mechanical polished) to expose the metal protrusions 1105, 1107, allowing access to the first and second metal layers 1104, 1106 (in addition to the top layer 1108) by devices or apparatuses positioned above the conformal power delivery structure.

In certain embodiments, the techniques described above with respect to FIGS. 3, 10 and/or 11 may be used to deposit additional metal layers to form fourth, fifth, sixth, or more power planes in a conformal power delivery structure. For instances, aspects of the process 1000 of FIG. 10 and process 1100 of FIG. 11 may be combined to produce a conformal power delivery structure that provides access to three (or more) power planes on both the top and bottom sides of the conformal power delivery structure.

Figure 12:
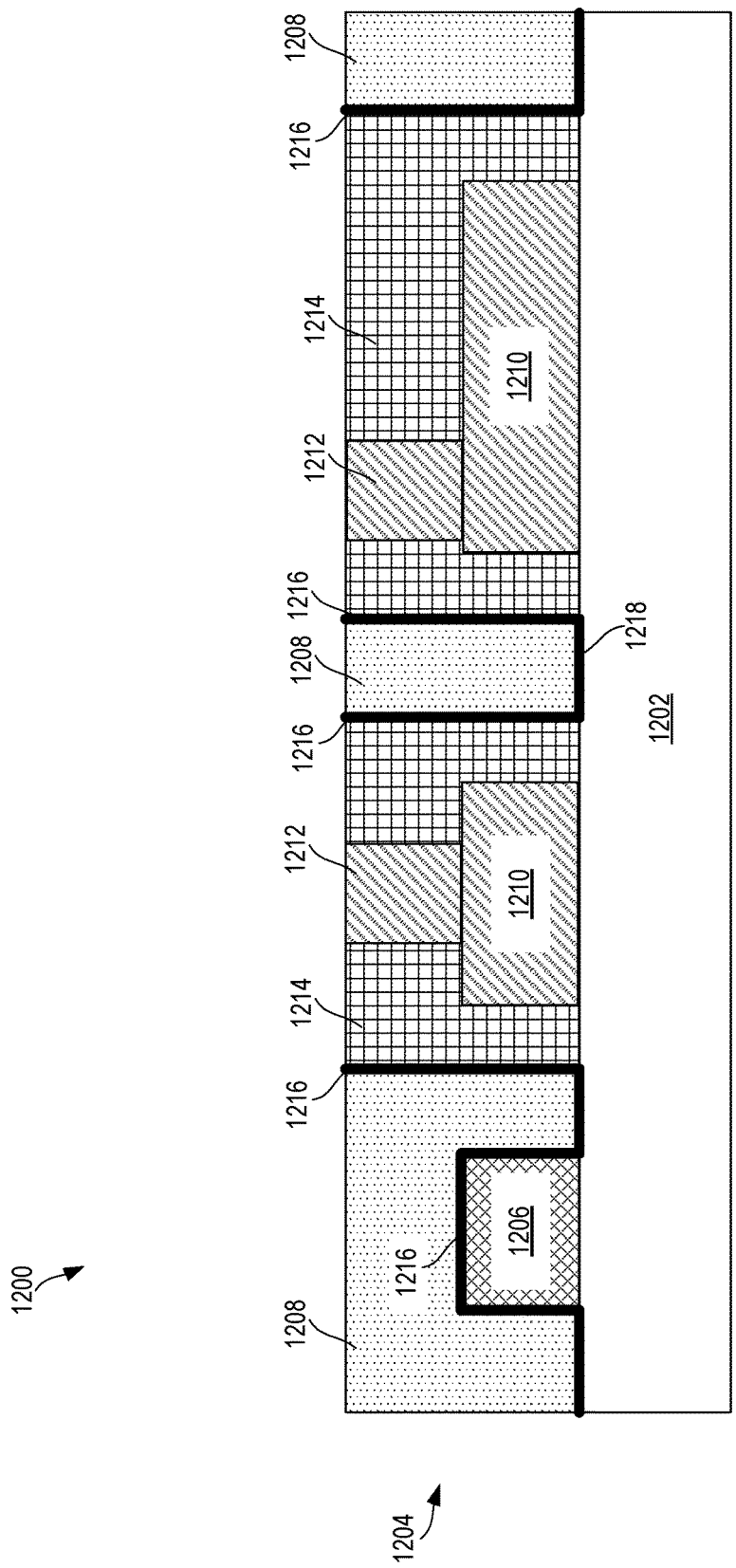
FIG. 12 illustrates an example system that includes a conformal power delivery structure near a high-speed signal trace.

Referring now to FIG. 12, in one embodiment, a system 1200 includes a package substrate 1202. In some embodiments, the package substrate 1202 may be similar to or embodied as, e.g., the package substrate 102, the package substrate 207, the substrate 302, the package substrate 902, etc., described above. A conformal power delivery structure 1204 is positioned on top of the package substrate 1202. The conformal power delivery structure 1204 may be similar to or embodied as, e.g., conformal power delivery structures 101, 211, 400, 500, 600, 700, 800, or 910A-910E described above. The conformal power delivery structure 1204 includes a first power plane 1206 and a second power plane 1208. The first power plane 1206 and second power plane 1208 are separated by a buffer stack 1216.

The system 1200 also includes one or more high-speed signal traces 1210. The high-speed signal traces 1210 are sensitive to capacitive coupling to other structures. In particular, if the second power plane 1208 was conformal to the high-seed signal traces 1210, capacitive coupling between the high-speed signal traces 1210 and the second power plane 1208 would deteriorate the performance of the high-speed signal traces 1210. In order to prevent or mitigate the influence of the second power plane 1208 on the high-speed signal traces 1210, one or more dielectric structures 1214 are positioned between the high-speed signal traces 1210 and the second power plane 1208. The dielectric structures 1214 reduces the capacitive coupling between the high-speed signal traces 1210 and the second power plane 1208.

As used herein, a high-speed signal trace refers to a trace that connects two or more circuit components that will transmit and/or receive a signal on the high-speed signal trace at an analog frequency of 100 megahertz or higher, and a high-speed signal refers to a signal at an analog frequency of 100 megahertz or higher. The high-speed signal traces 1210 may be used for any suitable signal, such as a Peripheral Component Interconnect Express (PCIe) interconnect (e.g., a PCIe 6 interconnect), a memory interconnect (such as a DDR or GDDR memory interconnect), a Compute Express Link (CXL) interconnect, a USB interconnect, a display interconnect, etc. The high-speed signal traces 1210 may carry differential signals (in which case the high-speed signal traces 1210 may be grouped into pairs), or one high-speed signal trace 1210 may carry a signal, and there may be a ground plane or other ground traces near the signal trace 1210. The high-speed signal traces 1210 may have any suitable width, such as any width from 50-150 micrometers. The high-speed signal traces 1210 may have any suitable height, any height from 5 micrometers to 40 micrometers. In the illustrative embodiment, the height of each high-speed signal trace 1210 is 20-25 micrometers.

Figure 13:
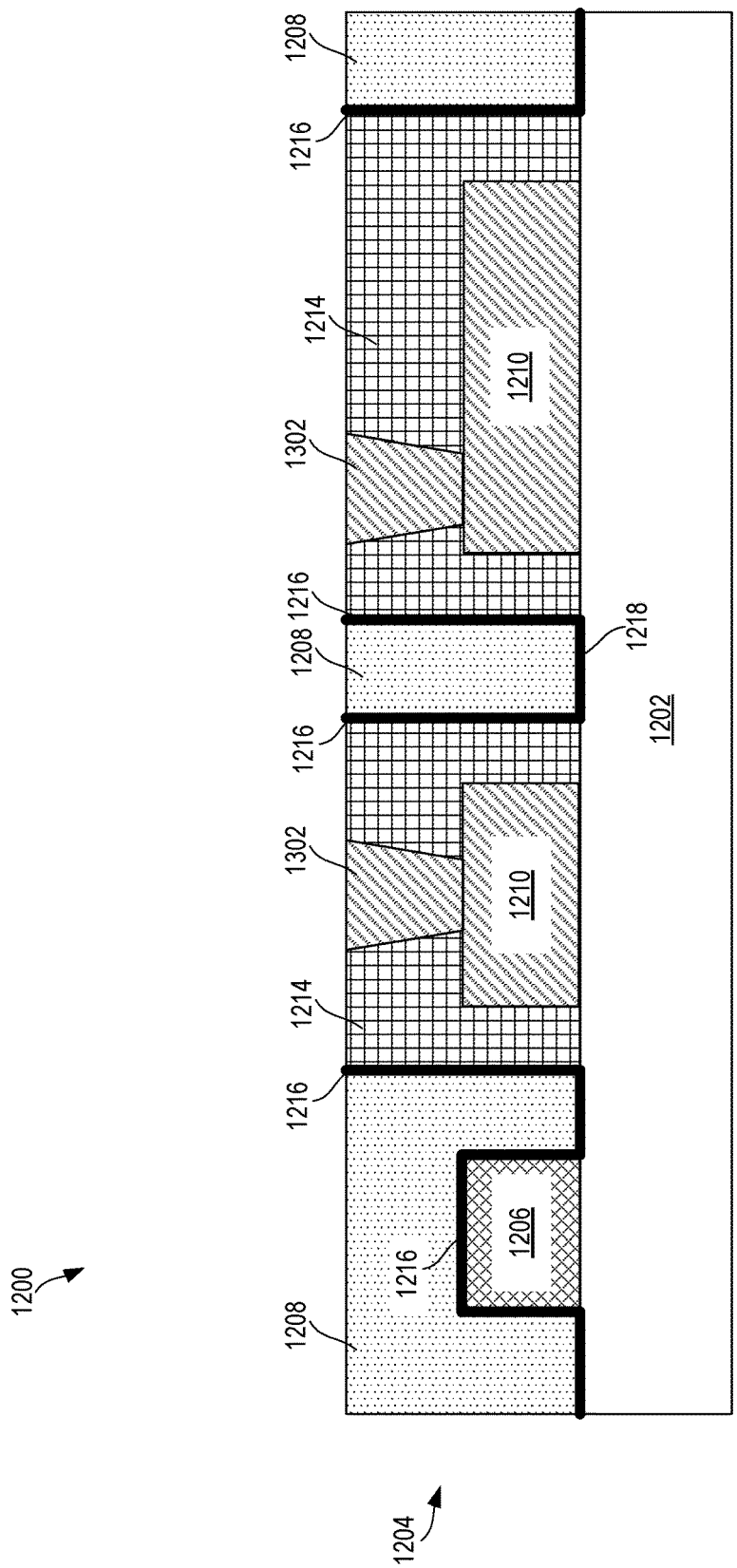
FIG. 13 illustrates an example system that includes a conformal power delivery structure near a high-speed signal trace.

In the illustrative embodiment, vias 1212 connect high-speed signal traces 1210 to another layer (not shown in FIG. 12). The vias 1212 may be created using, e.g., photolithographic processes. In some embodiments, such as the system 1200 shown in FIG. 13, vias 1302 may be created using laser drilling combined with, e.g., electroless plating and/or electroplating of copper to create the vias 1302. In some embodiments vias 1212 may pass through the conformal power delivery structure 1204 without landing on a high-speed signal trace 1210.

In the illustrative embodiment, the dielectric 1214 can be any suitable dielectric, such as a photoimageable dielectric, polyimide, an organic material interspersed with silica particles, epoxies interspersed with silica particles, etc. The dielectric 1214 can have any suitable width to separate the high-speed signal traces 1210 from the second power plane 1208 by any suitable distance. For example, the dielectric 1214 can separate the high-speed signal traces 1210 from the second power plane 1208 by, e.g., 10-200 micrometers.

In the illustrative embodiment, the buffer stack 1216 includes two or more layers. The buffer stack 1216 includes a dielectric layer to isolate the first power plane 1206 from the second power plane, and the buffer stack 1216 includes a buffer layer to protect the layers underneath it when the second power plane 1208 is applied using cold spray. The dielectric layer of the buffer stack 1216 may be, e.g., SiN, SiCN, TiO2, HfO2, SiO2, AlN, Al2O3, or other similar materials. The buffer layer of the buffer stack 1216 may be any material onto which copper or other suitable material can be applied by cold spray, such as titanium, tantalum, gold, or copper.

In some embodiments, the buffer stack 1216 may only include the buffer layer on which copper or other material can be cold sprayed. In some areas, such as between the first power plane 1206 and the second power plane 1208, a dielectric layer is needed to electrically isolate the layers on either side of the buffer stack. However, in some places, an electrical connection may be desirable or needed. For example, some areas of the substrate 1202 may require a connection to the second power plane 1208, in which case a dielectric layer should not be used. Instead, a buffer layer 1218 without a dielectric layer can be used.

Referring now to FIGS. 14-21, in one embodiment, several steps of a method for creating the system 1200 are shown. The system 1200 may be created using any suitable set of techniques that are used in semiconductor or printed circuit board processing, such as chemical vapor deposition, atomic layer deposition, physical layer deposition, molecular beam epitaxy, layer transfer, photolithography, ion implantation, dry etching, wet etching, thermal treatments, flip chip, layer transfer, magnetron sputter deposition, pulsed laser deposition, cold spray, etc.

Figure 14:
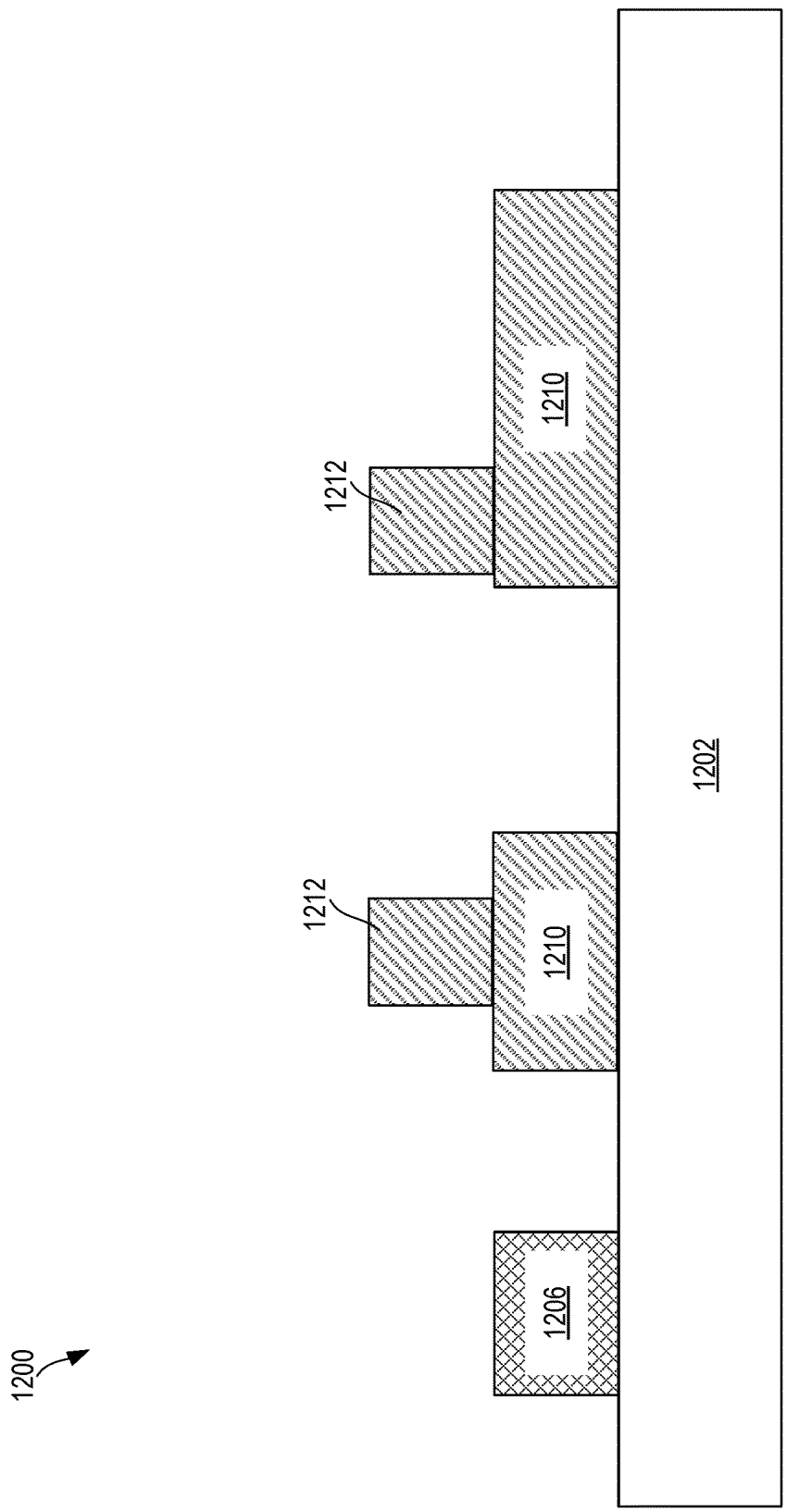
FIG. 14 illustrates an example system at one step of a method for creating a conformal power delivery structure near a high-speed signal trace.

In FIG. 14, a first power plane 1206 and one or more high-speed signal traces 1210 are formed over the substrate 1202. One or more vias 1212 may be formed on top of the high-speed signal traces 1210.

Figure 15:
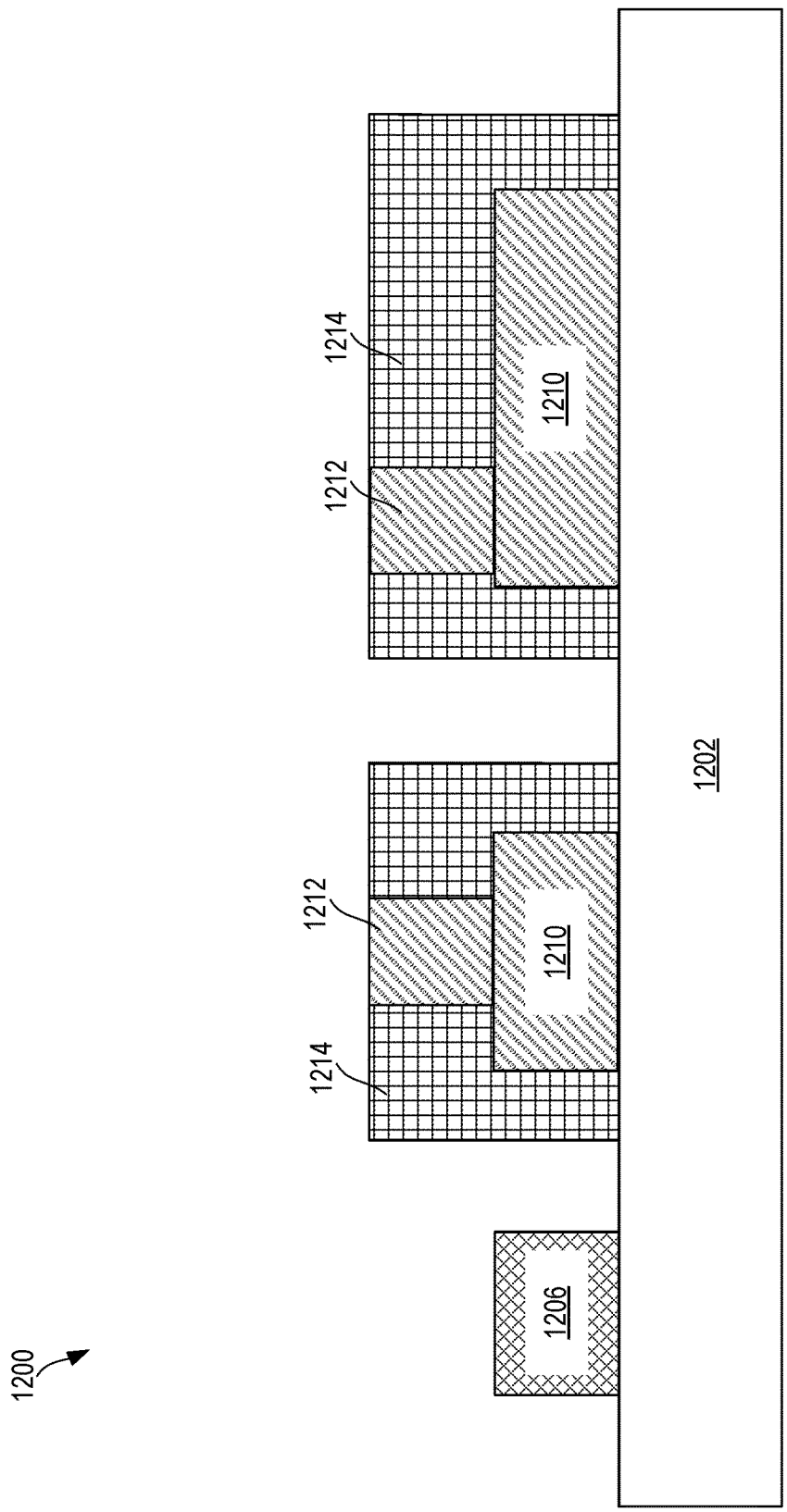
FIG. 15 illustrates an example system at one step of a method for creating a conformal power delivery structure near a high-speed signal trace.

In FIG. 15, a dielectric layer 1214 is formed around the high-speed signal traces 1210 to keep the second power plane 1208 a distance away from the high-speed signal traces 1210. The dielectric layer 1214 may be formed in any suitable manner, such as using photolithography.

Figure 16:
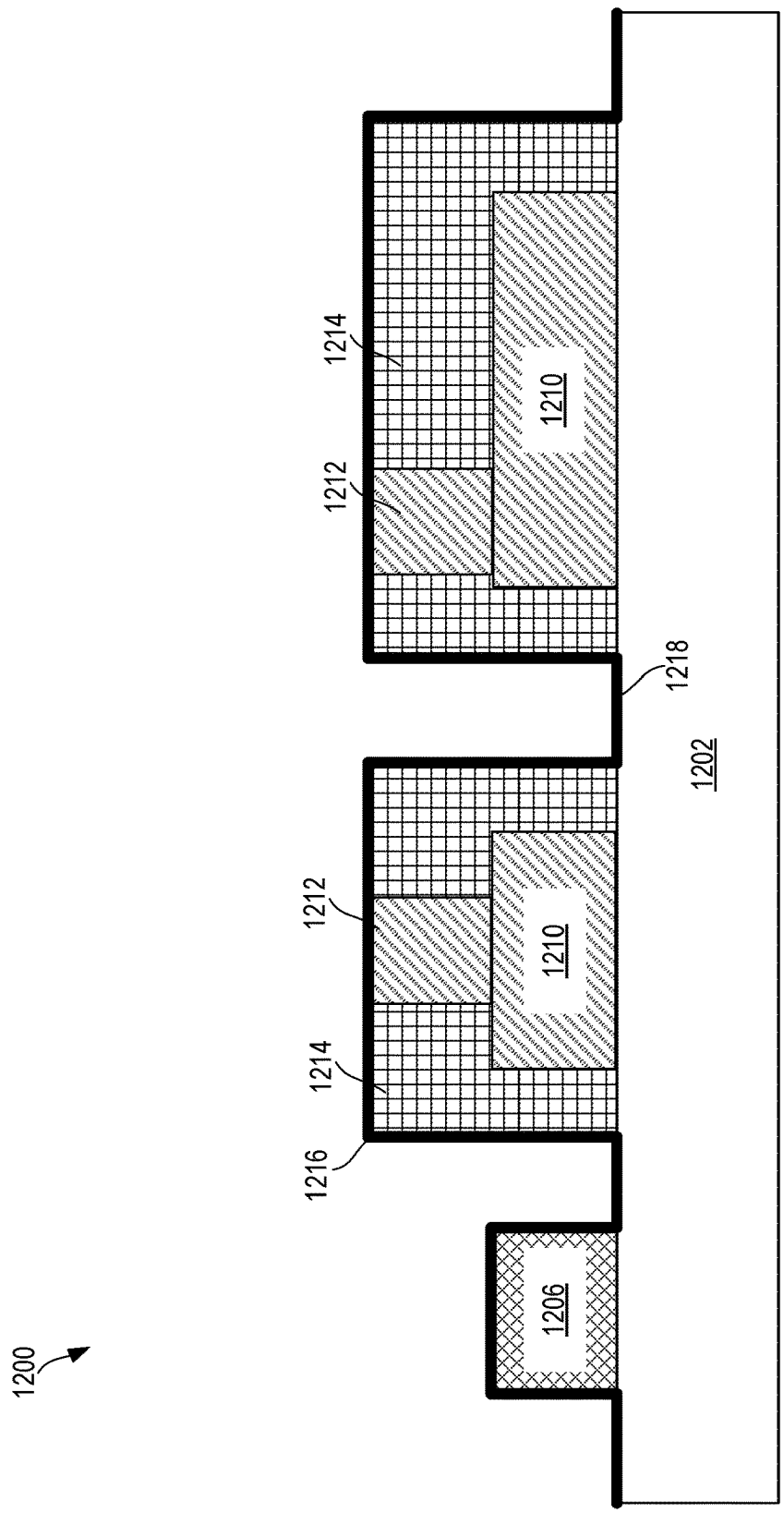
FIG. 16 illustrates an example system at one step of a method for creating a conformal power delivery structure near a high-speed signal trace.

In FIG. 16, a buffer stack 1216 is formed over the first power plane 1206, the vias 1212, and the dielectric 1214. The illustrative buffer stack 1216 includes a dielectric layer to electrically isolate the layer in contact with the dielectric layer from the second power plane 1208. The illustrative buffer stack 1216 also includes a buffer layer on which a cold spray layer can be deposited. In the illustrative embodiment, one or more areas that are to be electrically connected to the second power plane 1208 have a single buffer layer 1218 that is conductive. The buffer stack 1216 (i.e., the dielectric layer and/or the buffer layer) may be deposited using any suitable technique, such as atomic layer deposition, sputtering, electroless plating, electroplating, etc.

Figure 17:
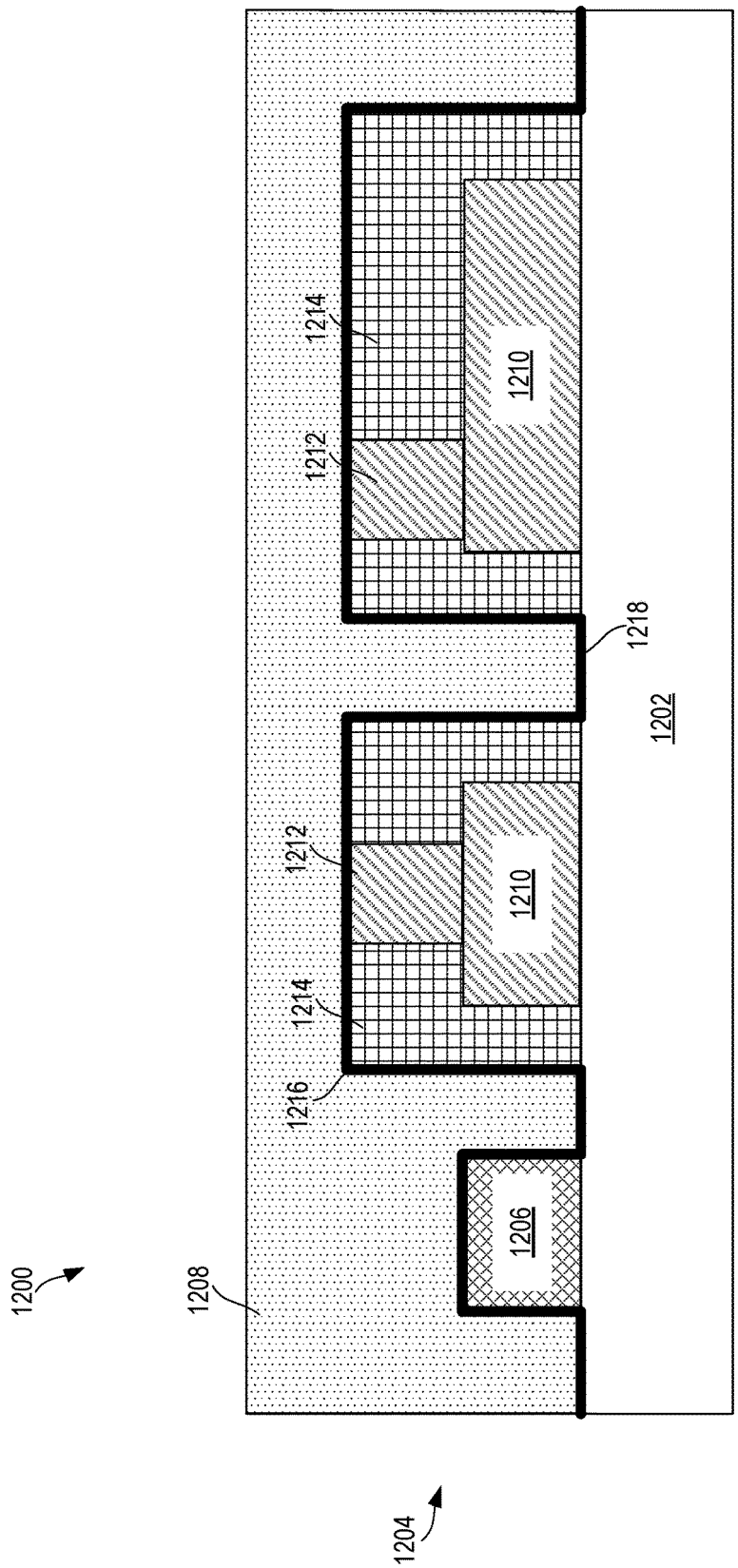
FIG. 17 illustrates an example system at one step of a method for creating a conformal power delivery structure near a high-speed signal trace.

In FIG. 17, the second power plane 1208 is deposited using cold spray or another high throughput additive manufacturing (HTAM) technique. The second power plane 1208 may have a physical grain structure that is characteristic of a cold spray structure, as discussed below in more detail in regard to FIG. 26. After the second power plane 1208 is deposited, the system 1200 is ground and/or polished down to expose the vias 1212, as shown in FIG. 12.

Figure 18:
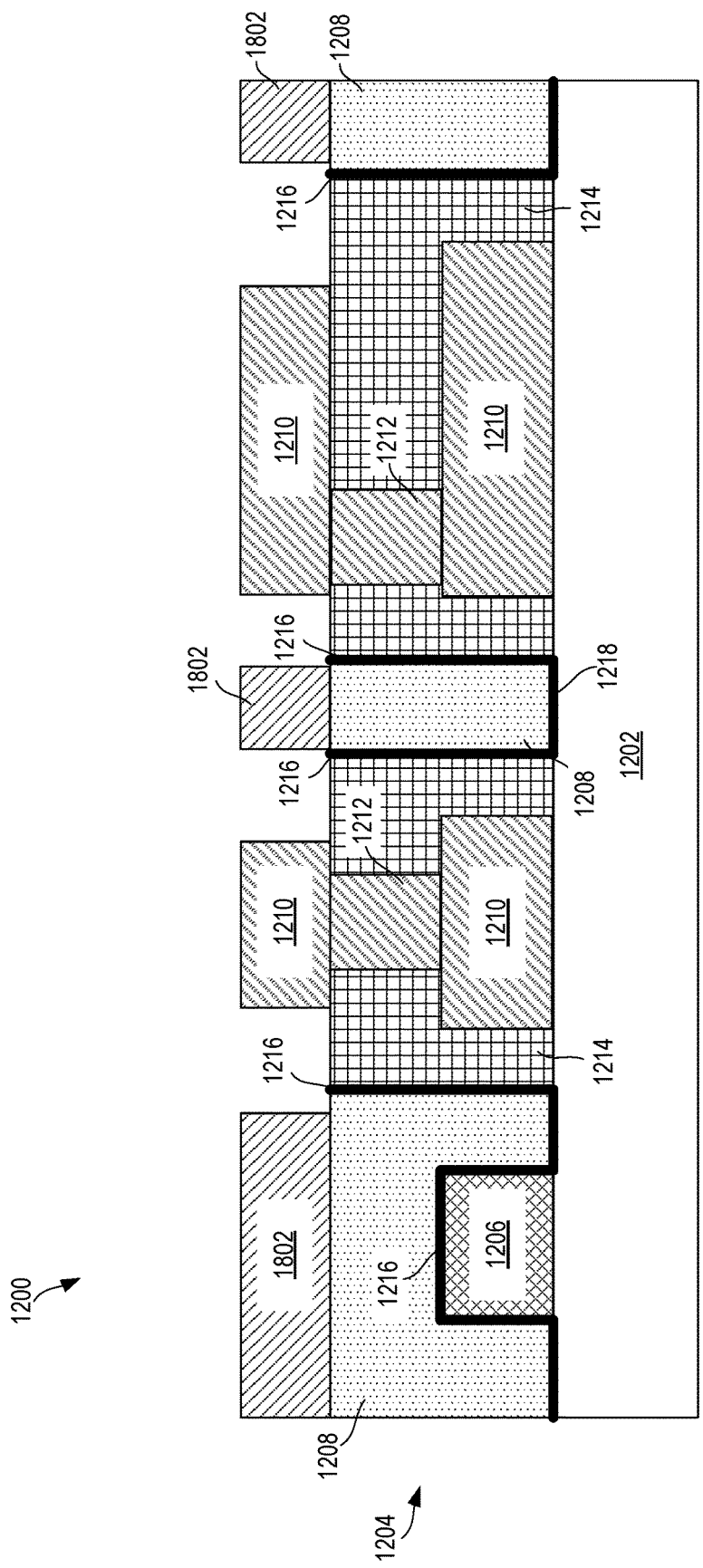
FIG. 18 illustrates an example system at one step of a method for creating a conformal power delivery structure near a high-speed signal trace.
Figure 19:
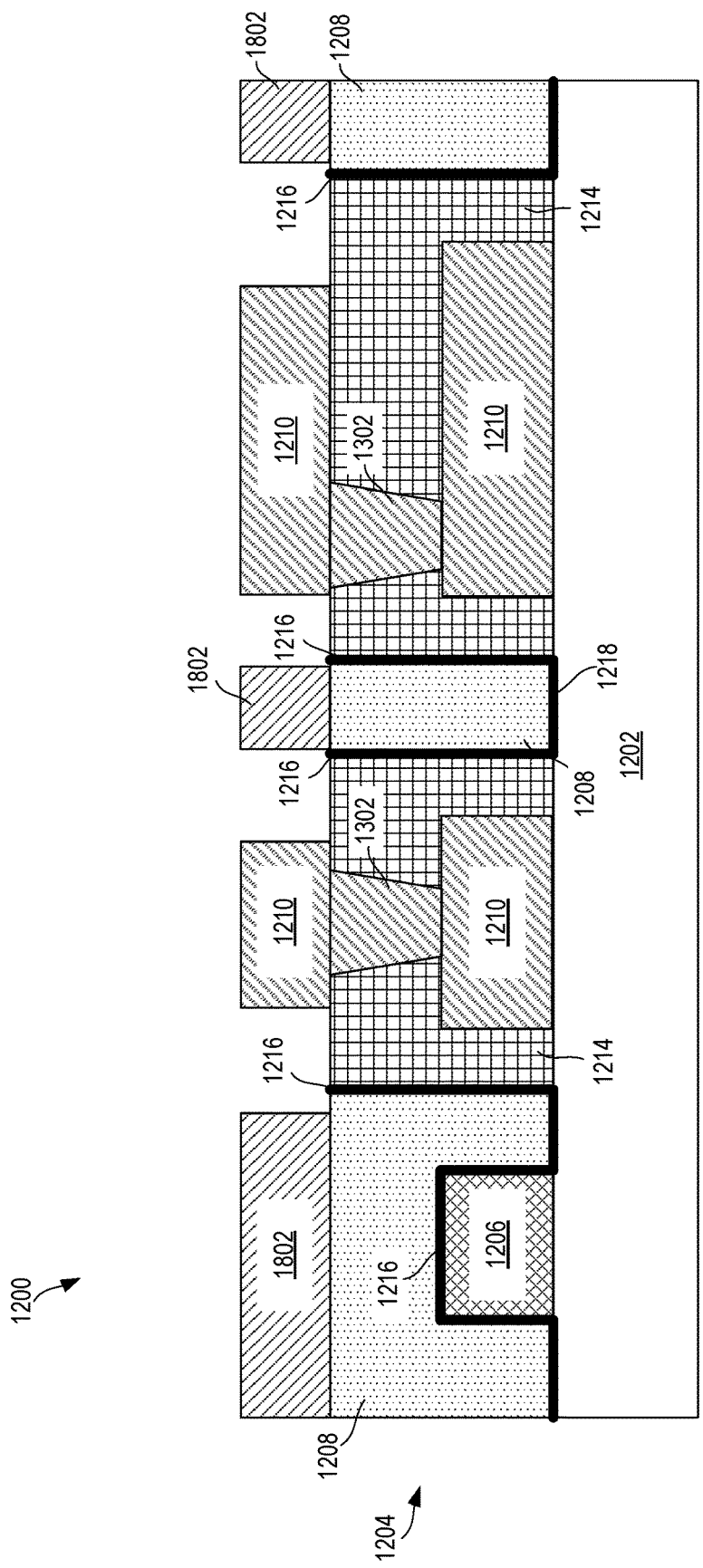
FIG. 19 illustrates an example system at one step of a method for creating a conformal power delivery structure near a high-speed signal trace.

In some embodiments, one or more additional layers may be added on the conformal power delivery structure 1204. For example, as shown in FIG. 18, one or more traces 1802 may be formed that are connected to the second power plane 1208. On the same layer, one or more high-speed signal traces 1210 may be formed on top of the vias 1212 to connect with the high-speed signal traces 1210 below. In FIG. 19, in one embodiment, the vias 1302 may be created using laser drilling combined with, e.g., electroless plating and/or electroplating of copper to create the vias 1302.

Figure 20:
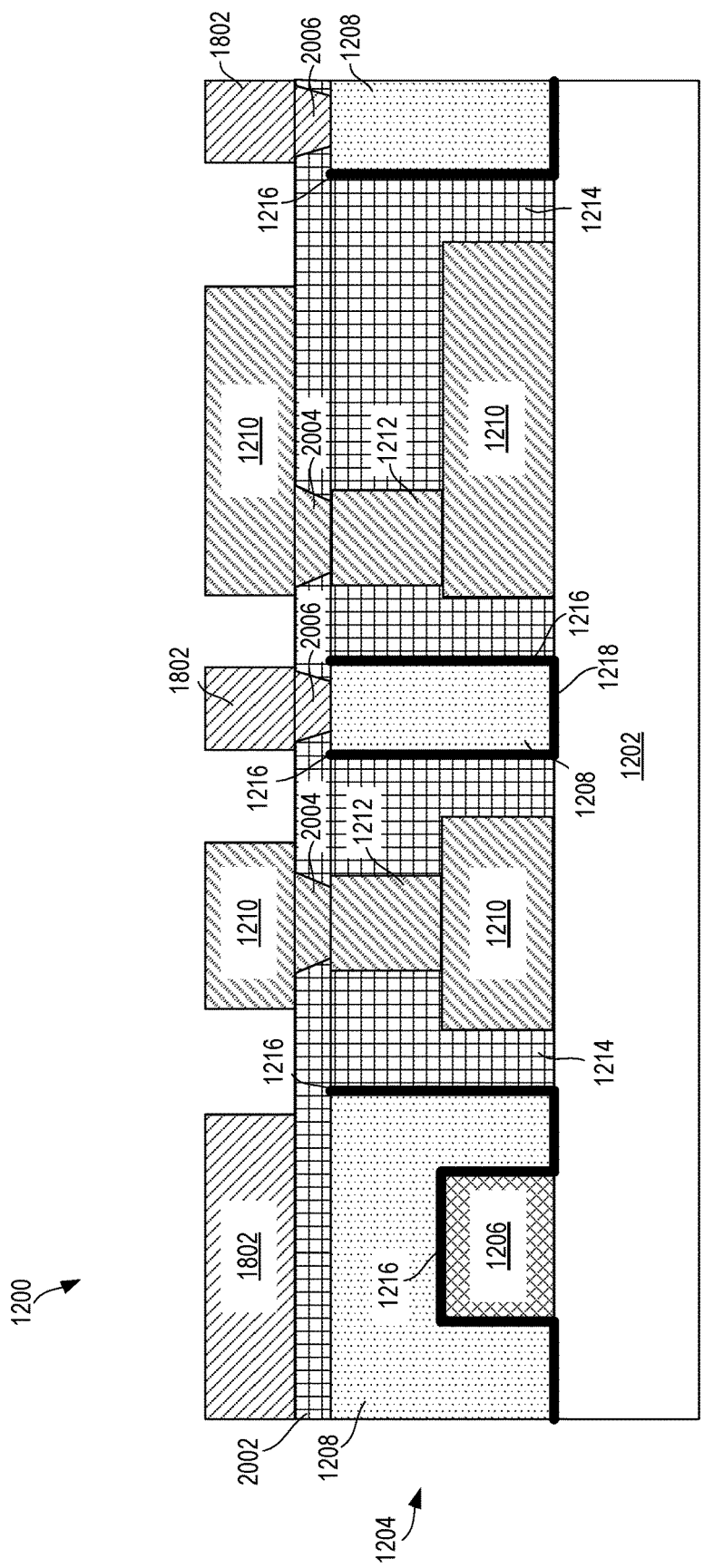
FIG. 20 illustrates an example system at one step of a method for creating a conformal power delivery structure near a high-speed signal trace.
Figure 21:
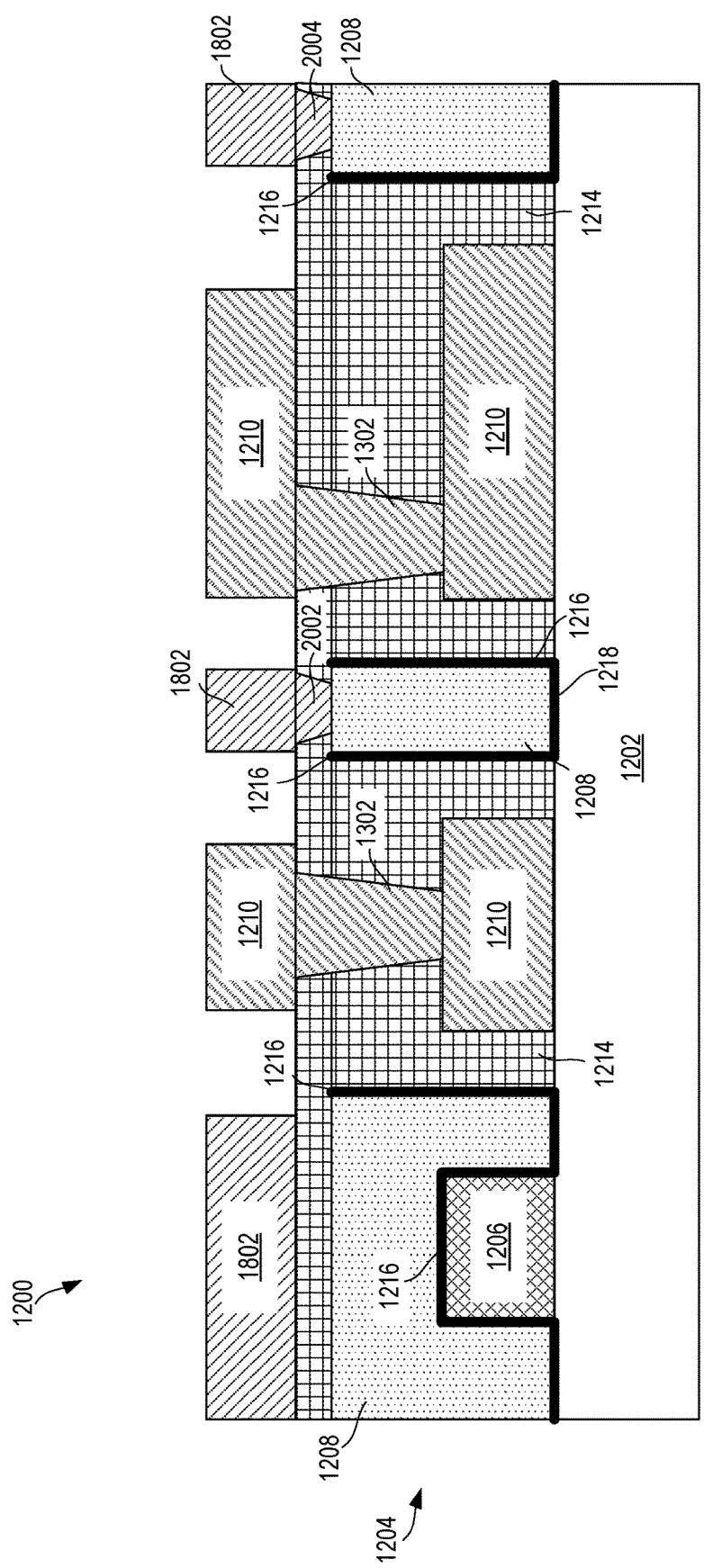
FIG. 21 illustrates an example system at one step of a method for creating a conformal power delivery structure near a high-speed signal trace.

In FIG. 20, in some embodiments, a dielectric layer 2002 may be added on top of the conformal power delivery structure 1204 before adding another layer of traces, adding flexibility at the cost of more processing steps. The dielectric layer 2002 may be added using any suitable process such as photolithography. Vias 2004 can be formed in the dielectric layer 2002 to connect high-speed trace signals 1210 on the upper layer to the via 1212 and high-speed trace signals 1210 on the lower layer. Similarly, vias 2006 can be formed in the dielectric layer 2002 to connect one or more traces 1802 to the second power plane 1208. In FIG. 21, in one embodiment, the vias 1302 may be created using laser drilling combined with, e.g., electroless plating and/or electroplating of copper to create the vias 1302.

Referring now to FIGS. 22-25, in one embodiment, several steps of a method for creating the system 1200 are shown. The system 1200 may be created using any suitable set of techniques that are used in semiconductor or printed circuit board processing, such as chemical vapor deposition, atomic layer deposition, physical layer deposition, molecular beam epitaxy, layer transfer, photolithography, ion implantation, dry etching, wet etching, thermal treatments, flip chip, magnetron sputter deposition, pulsed laser deposition, cold spray, etc. In the embodiment shown in FIGS. 22-25, the patterning of cold spray is controlled using a mask. The mask can define an edge of a cold spray region at a resolution of, e.g., 100 micrometers. As such, in order to avoid capacitive coupling with the second power plane 1208, the high-speed signal lines 1210 may be at least 100 micrometers from the edge of the second power plane 1208.

Figure 22:
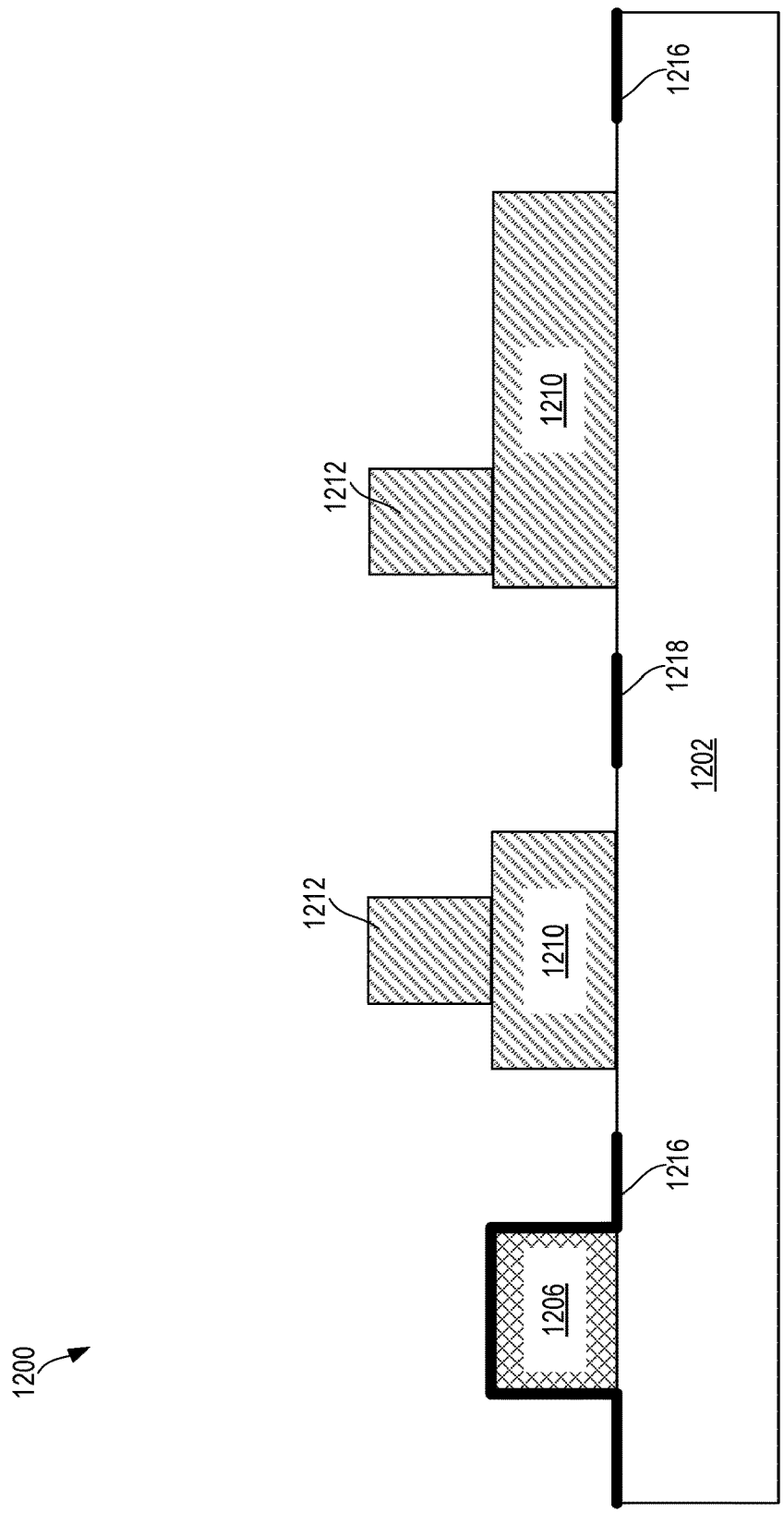
FIG. 22 illustrates an example system at one step of a method for creating a conformal power delivery structure near a high-speed signal trace.

In FIG. 22, a first power plane 1206 and one or more high-speed signal traces 1210 are formed over the substrate 1202. One or more vias 1212 may be formed on top of the high-speed signal traces 1210. A buffer stack 1216 is formed in the area that the cold spray will be deposited. In some embodiments, the buffer stack 1216 may extend, e.g., 100 micrometers beyond a cold spray region defined by a mask in order to ensure the buffer stack 1216 covers regions that are impacted by the cold spray. In some embodiments, a buffer layer 1218 without a dielectric may be used in areas where the second power plane 1208 should be in electrical contact with the substrate 1202. It should be appreciated that, as the cold spray will be masked off from the high-speed signal traces 1210, the high-speed signal traces 1210 do not need to be covered by the buffer layer 1216.

Figure 23:
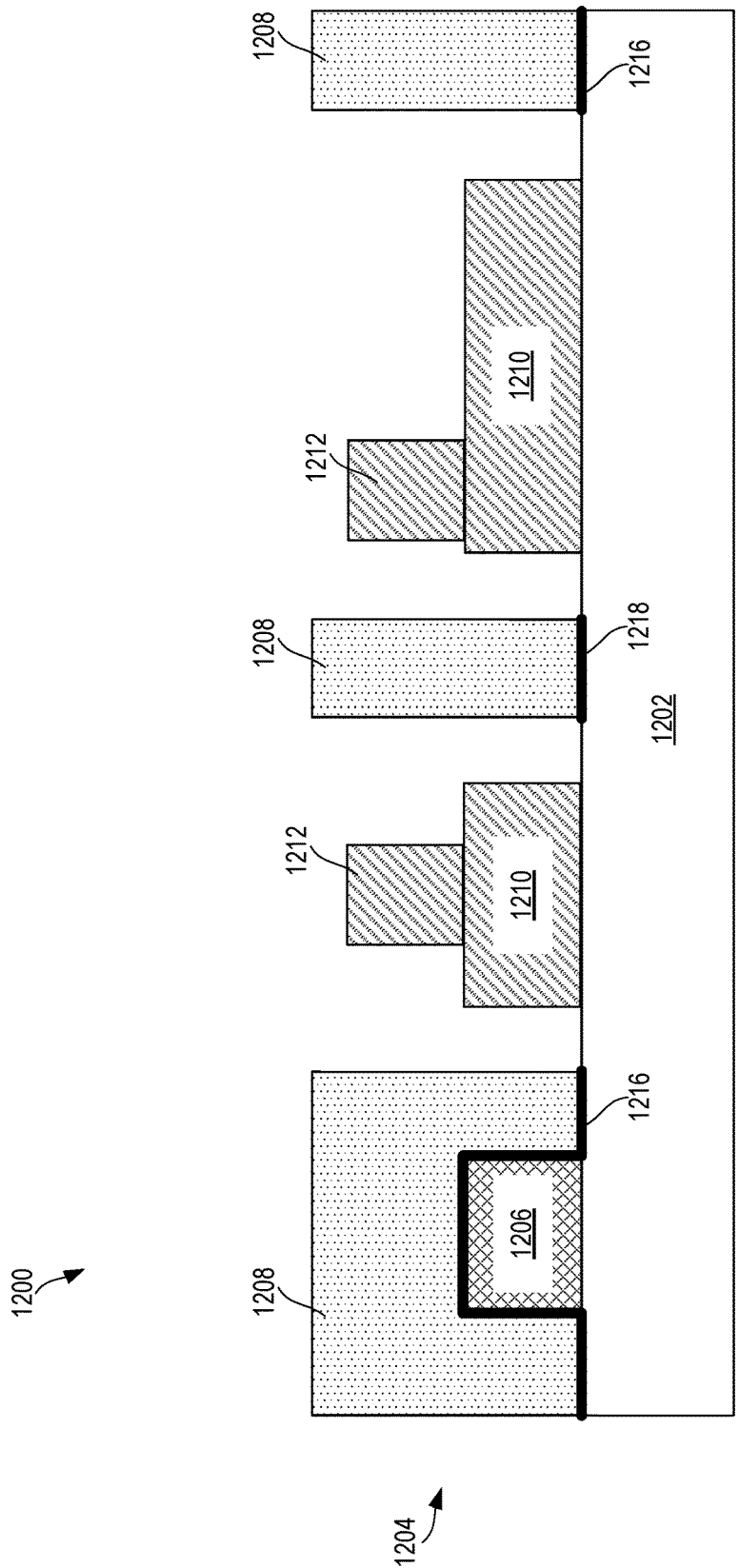
FIG. 23 illustrates an example system at one step of a method for creating a conformal power delivery structure near a high-speed signal trace.

In FIG. 23, the second power plane 1208 is applied using cold spray. A mask is used to only apply the second power plane 1208 in desired regions.

Figure 24:
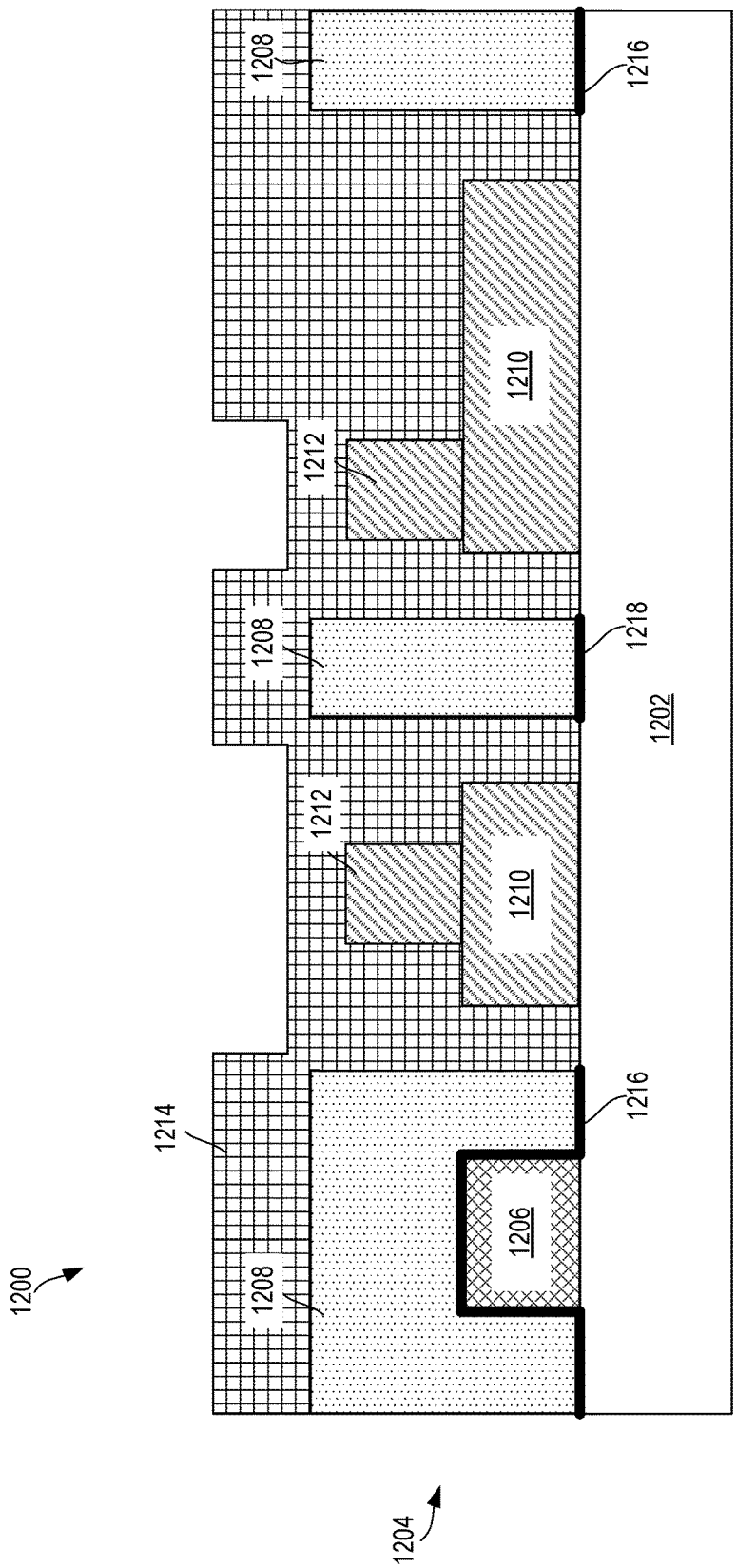
FIG. 24 illustrates an example system at one step of a method for creating a conformal power delivery structure near a high-speed signal trace.
Figure 25:
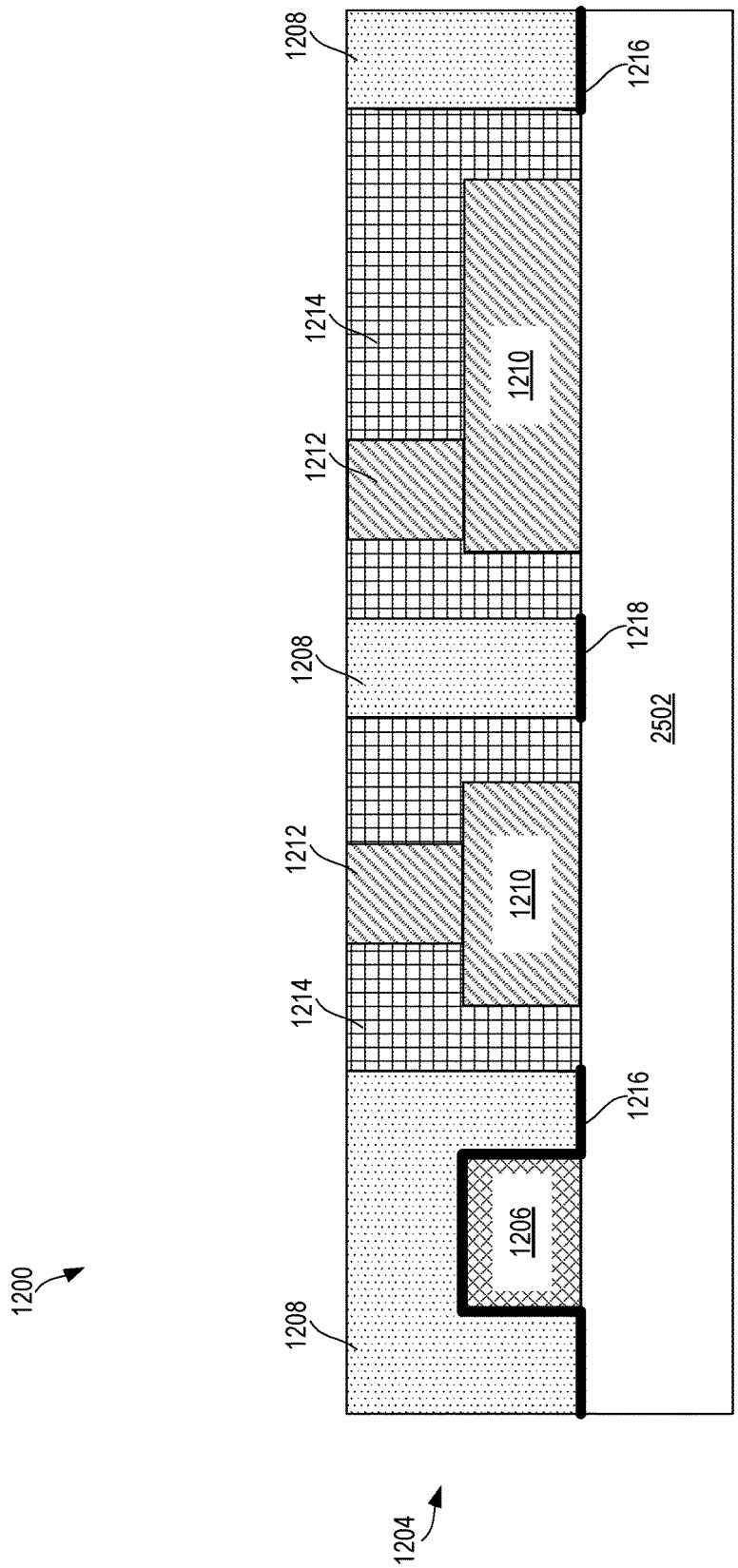
FIG. 25 illustrates an example system at one step of a method for creating a conformal power delivery structure near a high-speed signal trace.

In FIG. 24, a dielectric layer 1214 is applied over the second power plane 1208, the high-speed signal traces 1210, and the vias 1212. In FIG. 25, the dielectric layer 1214 and/or the second power plane 1208 is ground or polished down to expose the vias 1212.

Figure 26:
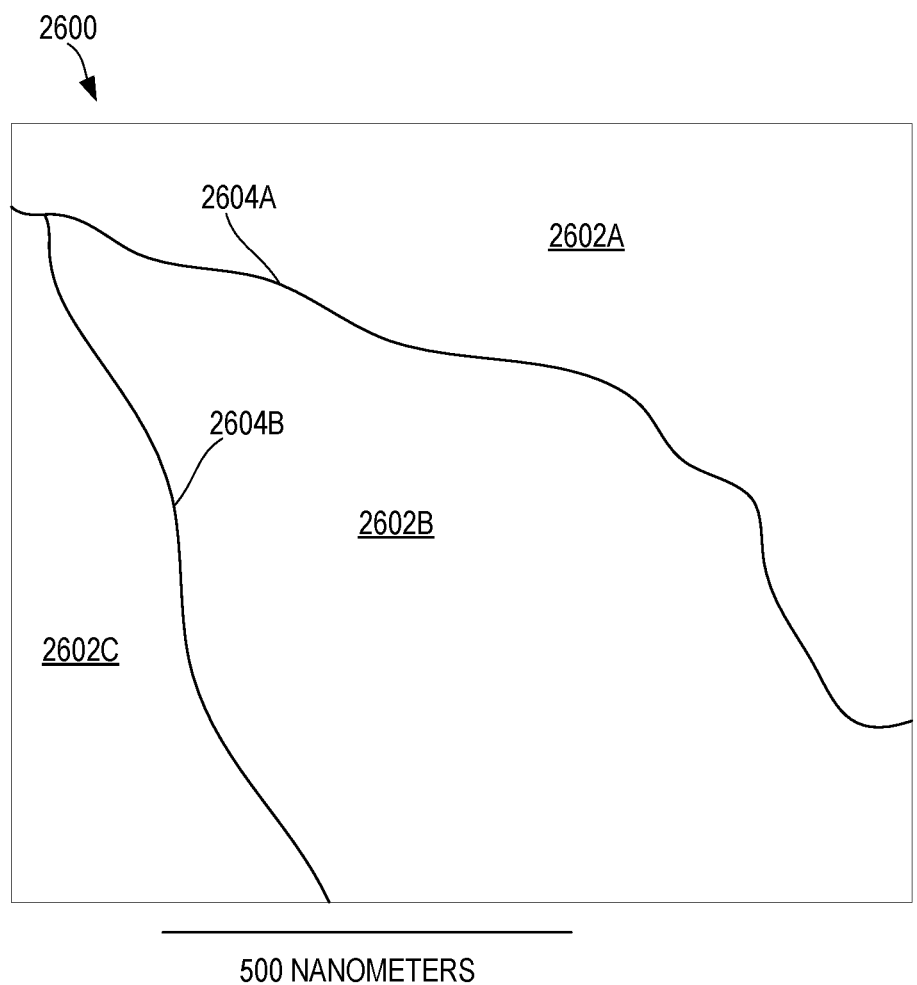
FIG. 26 illustrates one embodiment of a high-magnification cross-section of a cold spray structure.

Referring now to FIG. 26, in one embodiment, an illustration 2600 of a magnified view of a cold spray structure (such as the second power plane 1208) is shown. The illustration 2600 has a scale in the form of a line at the bottom, which has a width of 500 nanometers. The illustration shows several grains 2602, such as grain 2602A, grain 2602B, and grain 2602C. In the illustrative embodiment, each grain 2602A-C has a length, width, height, and/or diameter of, e.g., 10-100 micrometers. Grain boundaries (such as grain boundary 2604A, 2604B) are present between the various grains 2602A-C. The grain boundaries are visible in, e.g., a scanning electron microscope image taken of a cross-section of a cold spray structure.

Figure 27:
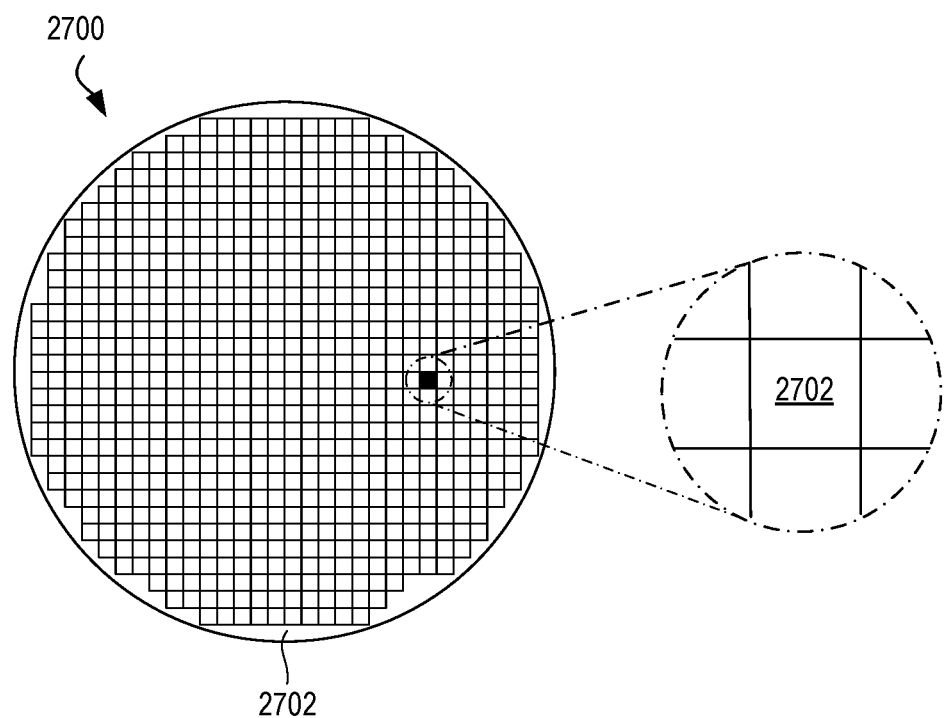
FIG. 27 is a top view of a wafer and dies that may be included in a microelectronic assembly, in accordance with any of the embodiments disclosed herein.

FIG. 27 is a top view of a wafer 2700 and dies 2702 that may include any of the conformal power delivery structures disclosed herein. The wafer 2700 may be composed of semiconductor material and may include one or more dies 2702 having integrated circuit structures formed on a surface of the wafer 2700. The individual dies 2702 may be a repeating unit of an integrated circuit product that includes any suitable integrated circuit. After the fabrication of the semiconductor product is complete, the wafer 2700 may undergo a singulation process in which the dies 2702 are separated from one another to provide discrete "chips" of the integrated circuit product. The die 2702 may include one or more transistors (e.g., some of the transistors 2840 of FIG. 28, discussed below), supporting circuitry to route electrical signals to the transistors, passive components (e.g., signal traces, resistors, capacitors, or inductors), and/or any other integrated circuit components. In some embodiments, the wafer 2700 or the die 2702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 2702. For example, a memory array formed by multiple memory devices may be formed on a same die 2702 as a processor unit (e.g., the processor unit 3102 of FIG. 31) or other logic that is configured to store information in the memory devices or execute instructions stored in the memory array. Various embodiments disclosed herein may be manufactured using a die-to-wafer assembly technique in which some dies are attached to a wafer 2700 that include others of the dies, and the wafer 2700 is subsequently singulated.

Figure 28:
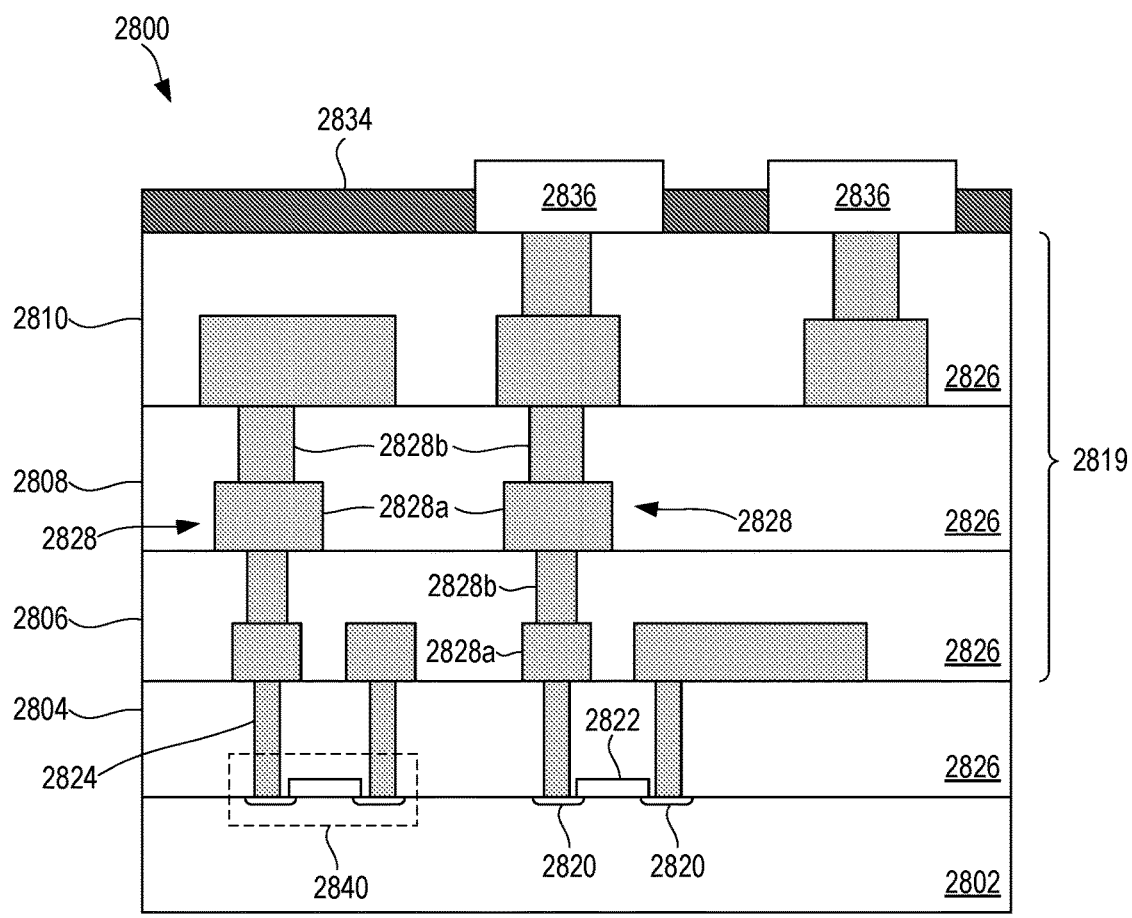
FIG. 28 is a cross-sectional side view of an integrated circuit device that may be included in a microelectronic assembly, in accordance with any of the embodiments disclosed herein.

FIG. 28 is a cross-sectional side view of an integrated circuit device 2800 that may include any of the conformal power delivery structures disclosed herein. One or more of the integrated circuit devices 2800 may be included in one or more dies 2702 (FIG. 27). The integrated circuit device 2800 may be formed on a die substrate 2802 (e.g., the wafer 2700 of FIG. 27) and may be included in a die (e.g., the die 2702 of FIG. 27). The die substrate 2802 may be a semiconductor substrate composed of semiconductor material systems including, for example, n-type or p-type materials systems (or a combination of both). The die substrate 2802 may include, for example, a crystalline substrate formed using a bulk silicon or a silicon-on-insulator (SOI) substructure. In some embodiments, the die substrate 2802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 2802. Although a few examples of materials from which the die substrate 2802 may be formed are described here, any material that may serve as a foundation for an integrated circuit device 2800 may be used. The die substrate 2802 may be part of a singulated die (e.g., the dies 2702 of FIG. 27) or a wafer (e.g., the wafer 2700 of FIG. 27).

The integrated circuit device 2800 may include one or more device layers 2804 disposed on the die substrate 2802. The device layer 2804 may include features of one or more transistors 2840 (e.g., metal oxide semiconductor field-effect transistors (MOSFETs)) formed on the die substrate 2802.

The transistors 2840 may include, for example, one or more source and/or drain (S/D) regions 2820, a gate 2822 to control current flow between the S/D regions 2820, and one or more S/D contacts 2824 to route electrical signals to/from the S/D regions 2820. The transistors 2840 may include additional features not depicted for the sake of clarity, such as device isolation regions, gate contacts, and the like. The transistors 2840 are not limited to the type and configuration depicted in FIG. 28 and may include a wide variety of other types and configurations such as, for example, planar transistors, non-planar transistors, or a combination of both. Non- planar transistors may include FinFET transistors, such as double-gate transistors or tri-gate transistors, and wrap-around or all-around gate transistors, such as nanoribbon, nanosheet, or nanowire transistors.

FIGS. 29A-29D are simplified perspective views of example planar, FinFET, gate-all-around, and stacked gate-all-around transistors. The transistors illustrated in FIGS. 29A-29D are formed on a substrate 2916 having a surface 2908. Isolation regions 2914 separate the source and drain regions of the transistors from other transistors and from a bulk region 2918 of the substrate 2916.

Figure 29B:
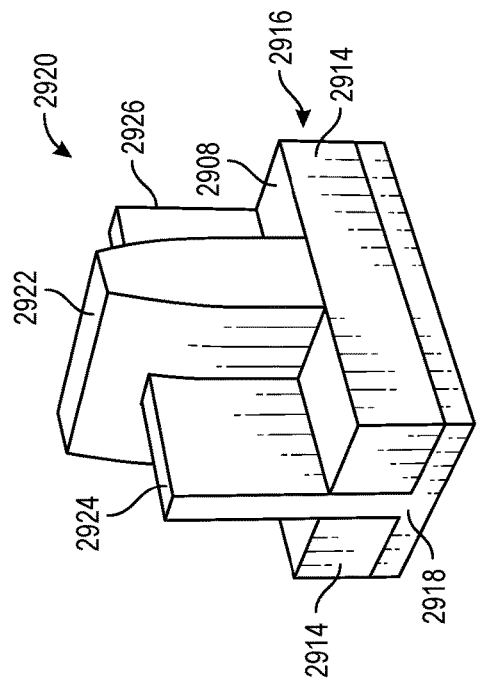
FIGS. 29A-29D are perspective views of example planar, gate-all-around, and stacked gate-all-around transistors.
Figure 29D:
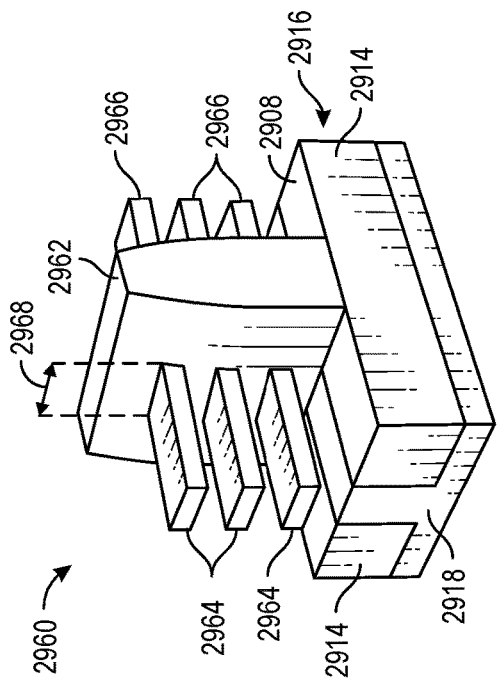
Figure 29A:
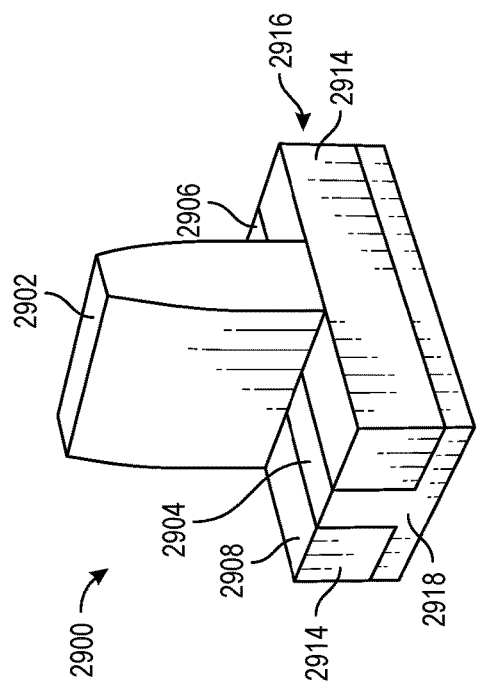

FIG. 29A is a perspective view of an example planar transistor 2900 comprising a gate 2902 that controls current flow between a source region 2904 and a drain region 2906. The transistor 2900 is planar in that the source region 2904 and the drain region 2906 are planar with respect to the substrate surface 2908.

FIG. 29B is a perspective view of an example FinFET transistor 2920 comprising a gate 2922 that controls current flow between a source region 2924 and a drain region 2926. The transistor 2920 is non-planar in that the source region 2924 and the drain region 2926 comprise "fins" that extend upwards from the substrate surface 2928. As the gate 2922 encompasses three sides of the semiconductor fin that extends from the source region 2924 to the drain region 2926, the transistor 2920 can be considered a tri-gate transistor. FIG. 29B illustrates one S/D fin extending through the gate 2922, but multiple S/D fins can extend through the gate of a FinFET transistor.

Figure 29C:
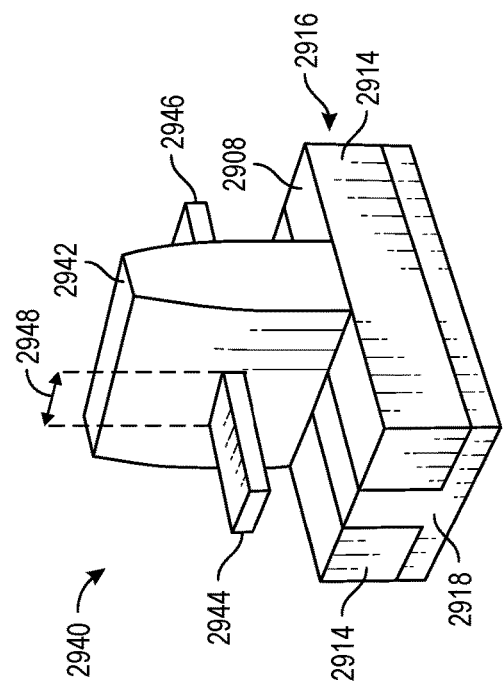

FIG. 29C is a perspective view of a gate-all-around (GAA) transistor 2940 comprising a gate 2942 that controls current flow between a source region 2944 and a drain region 2946. The transistor 2940 is non-planar in that the source region 2944 and the drain region 2946 are elevated from the substrate surface 2928.

FIG. 29D is a perspective view of a GAA transistor 2960 comprising a gate 2962 that controls current flow between multiple elevated source regions 2964 and multiple elevated drain regions 2966. The transistor 2960 is a stacked GAA transistor as the gate controls the flow of current between multiple elevated S/D regions stacked on top of each other. The transistors 2940 and 2960 are considered gate-all-around transistors as the gates encompass all sides of the semiconductor portions that extends from the source regions to the drain regions. The transistors 2940 and 2960 can alternatively be referred to as nanowire, nanosheet, or nanoribbon transistors depending on the width (e.g., widths 2948 and 2968 of transistors 2940 and 2960, respectively) of the semiconductor portions extending through the gate.

Returning to FIG. 28, a transistor 2840 may include a gate 2822 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 2840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 2840 along the source-channel-drain direction, the gate electrode may consist of a U-shaped structure that includes a bottom portion substantially parallel to the surface of the die substrate 2802 and two sidewall portions that are substantially perpendicular to the top surface of the die substrate 2802. In other embodiments, at least one of the metal layers that form the gate electrode may simply be a planar layer that is substantially parallel to the top surface of the die substrate 2802 and does not include sidewall portions substantially perpendicular to the top surface of the die substrate 2802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2820 may be formed within the die substrate 2802 adjacent to the gate 2822 of individual transistors 2840. The S/D regions 2820 may be formed using an implantation/diffusion process or an etching/deposition process, for example. In the former process, dopants such as boron, aluminum, antimony, phosphorous, or arsenic may be ion-implanted into the die substrate 2802 to form the S/D regions 2820. An annealing process that activates the dopants and causes them to diffuse farther into the die substrate 2802 may follow the ion-implantation process. In the latter process, the die substrate 2802 may first be etched to form recesses at the locations of the S/D regions 2820. An epitaxial deposition process may then be carried out to fill the recesses with material that is used to fabricate the S/D regions 2820. In some implementations, the S/D regions 2820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2820 may be formed using one or more alternate semiconductor materials such as germanium or a group III-V material or alloy. In further embodiments, one or more layers of metal and/or metal alloys may be used to form the S/D regions 2820.

Electrical signals, such as power and/or input/output (I/O) signals, may be routed to and/or from the devices (e.g., transistors 2840) of the device layer 2804 through one or more interconnect layers disposed on the device layer 2804 (illustrated in FIG. 28 as interconnect layers 2806-2810). For example, electrically conductive features of the device layer 2804 (e.g., the gate 2822 and the S/D contacts 2824) may be electrically coupled with the interconnect structures 2828 of the interconnect layers 2806-2810. The one or more interconnect layers 2806-2810 may form a metallization stack (also referred to as an "ILD stack") 2819 of the integrated circuit device 2800.

The interconnect structures 2828 may be arranged within the interconnect layers 2806-2810 to route electrical signals according to a wide variety of designs; in particular, the arrangement is not limited to the particular configuration of interconnect structures 2828 depicted in FIG. 28. Although a particular number of interconnect layers 2806-2810 is depicted in FIG. 28, embodiments of the present disclosure include integrated circuit devices having more or fewer interconnect layers than depicted.

In some embodiments, the interconnect structures 2828 may include lines 2828a and/or vias 2828b filled with an electrically conductive material such as a metal. The lines 2828a may be arranged to route electrical signals in a direction of a plane that is substantially parallel with a surface of the die substrate 2802 upon which the device layer 2804 is formed. For example, the lines 2828a may route electrical signals in a direction in and out of the page and/or in a direction across the page from the perspective of FIG. 13. The vias 2828b may be arranged to route electrical signals in a direction of a plane that is substantially perpendicular to the surface of the die substrate 2802 upon which the device layer 2804 is formed. In some embodiments, the vias 2828b may electrically couple lines 2828a of different interconnect layers 2806-2810 together.

The interconnect layers 2806-2810 may include a dielectric material 2826 disposed between the interconnect structures 2828, as shown in FIG. 28. In some embodiments, dielectric material 2826 disposed between the interconnect structures 2828 in different ones of the interconnect layers 2806-2810 may have different compositions; in other embodiments, the composition of the dielectric material 2826 between different interconnect layers 2806-2810 may be the same. The device layer 2804 may include a dielectric material 2826 disposed between the transistors 2840 and a bottom layer of the metallization stack as well. The dielectric material 2826 included in the device layer 2804 may have a different composition than the dielectric material 2826 included in the interconnect layers 2806-2810; in other embodiments, the composition of the dielectric material 2826 in the device layer 2804 may be the same as a dielectric material 2826 included in any one of the interconnect layers 2806-2810.

A first interconnect layer 2806 (referred to as Metal 1 or "M1") may be formed directly on the device layer 2804. In some embodiments, the first interconnect layer 2806 may include lines 2828a and/or vias 2828b, as shown. The lines 2828a of the first interconnect layer 2806 may be coupled with contacts (e.g., the S/D contacts 2824) of the device layer 2804. The vias 2828b of the first interconnect layer 2806 may be coupled with the lines 2828a of a second interconnect layer 2808.

The second interconnect layer 2808 (referred to as Metal 2 or "M2") may be formed directly on the first interconnect layer 2806. In some embodiments, the second interconnect layer 2808 may include via 2828b to couple the lines 2828 of the second interconnect layer 2808 with the lines 2828a of a third interconnect layer 2810. Although the lines 2828a and the vias 2828b are structurally delineated with a line within individual interconnect layers for the sake of clarity, the lines 2828a and the vias 2828b may be structurally and/or materially contiguous (e.g., simultaneously filled during a dual-damascene process) in some embodiments.

The third interconnect layer 2810 (referred to as Metal 3 or "M3") (and additional interconnect layers, as desired) may be formed in succession on the second interconnect layer 2808 according to similar techniques and configurations described in connection with the second interconnect layer 2808 or the first interconnect layer 2806. In some embodiments, the interconnect layers that are "higher up" in the metallization stack 2819 in the integrated circuit device 2800 (i.e., farther away from the device layer 2804) may be thicker that the interconnect layers that are lower in the metallization stack 2819, with lines 2828a and vias 2828b in the higher interconnect layers being thicker than those in the lower interconnect layers.

The integrated circuit device 2800 may include a solder resist material 2834 (e.g., polyimide or similar material) and one or more conductive contacts 2836 formed on the interconnect layers 2806-2810. In FIG. 28, the conductive contacts 2836 are illustrated as taking the form of bond pads. The conductive contacts 2836 may be electrically coupled with the interconnect structures 2828 and configured to route the electrical signals of the transistor(s) 2840 to external devices. For example, solder bonds may be formed on the one or more conductive contacts 2836 to mechanically and/or electrically couple an integrated circuit die including the integrated circuit device 2800 with another component (e.g., a printed circuit board). The integrated circuit device 2800 may include additional or alternate structures to route the electrical signals from the interconnect layers 2806-2810; for example, the conductive contacts 2836 may include other analogous features (e.g., posts) that route the electrical signals to external components.

In some embodiments in which the integrated circuit device 2800 is a double-sided die, the integrated circuit device 2800 may include another metallization stack (not shown) on the opposite side of the device layer(s) 2804. This metallization stack may include multiple interconnect layers as discussed above with reference to the interconnect layers 2806-2810, to provide conductive pathways (e.g., including conductive lines and vias) between the device layer(s) 2804 and additional conductive contacts (not shown) on the opposite side of the integrated circuit device 2800 from the conductive contacts 2836.

In other embodiments in which the integrated circuit device 2800 is a double-sided die, the integrated circuit device 2800 may include one or more through silicon vias (TSVs) through the die substrate 2802; these TSVs may make contact with the device layer(s) 2804, and may provide conductive pathways between the device layer(s) 2804 and additional conductive contacts (not shown) on the opposite side of the integrated circuit device 2800 from the conductive contacts 2836. In some embodiments, TSVs extending through the substrate can be used for routing power and ground signals from conductive contacts on the opposite side of the integrated circuit device 2800 from the conductive contacts 2836 to the transistors 2840 and any other components integrated into the die 2800, and the metallization stack 2819 can be used to route I/O signals from the conductive contacts 2836 to transistors 2840 and any other components integrated into the die 2800.

Multiple integrated circuit devices 2800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 30:
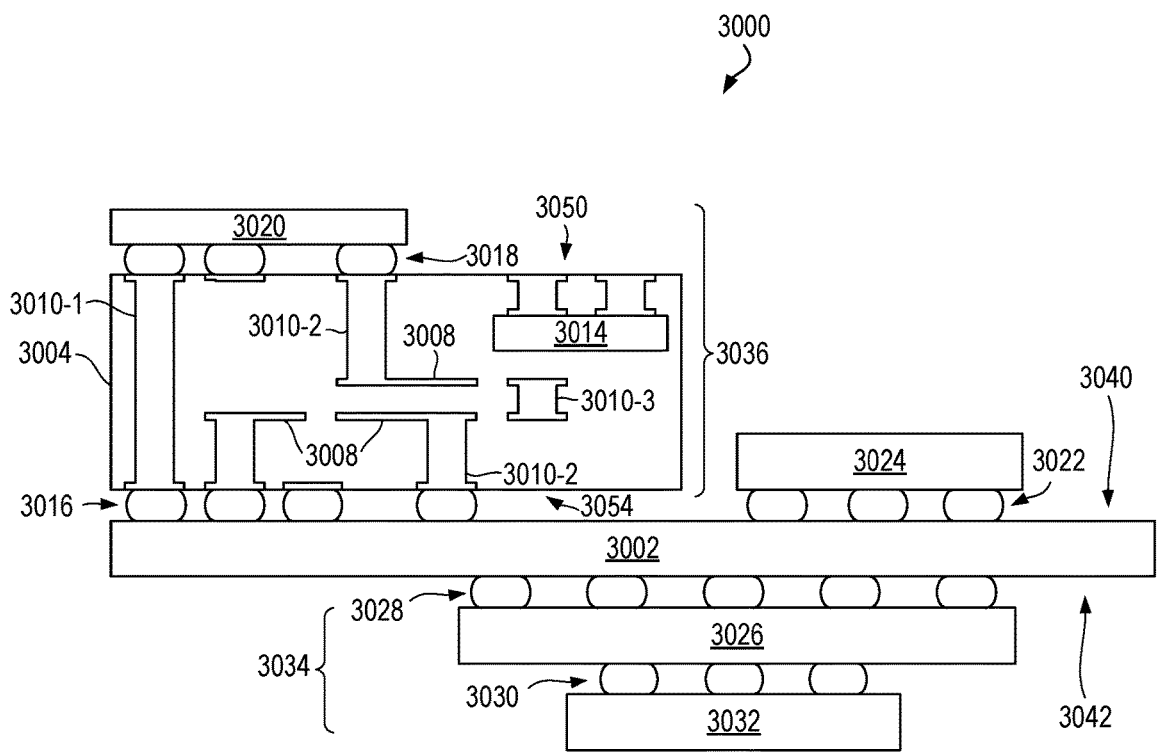
FIG. 30 is a cross-sectional side view of an integrated circuit device assembly that may include a microelectronic assembly, in accordance with any of the embodiments disclosed herein.

FIG. 30 is a cross-sectional side view of an integrated circuit device assembly 3000 that may include any of the conformal power delivery structures disclosed herein. In some embodiments, the integrated circuit device assembly 3000 may be a microelectronic assembly. The integrated circuit device assembly 3000 includes a number of components disposed on a circuit board 3002 (which may be a motherboard, system board, mainboard, etc.). The integrated circuit device assembly 3000 includes components disposed on a first face 3040 of the circuit board 3002 and an opposing second face 3042 of the circuit board 3002; generally, components may be disposed on one or both faces 3040 and 3042.

In some embodiments, the circuit board 3002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 3002. In other embodiments, the circuit board 3002 may be a non-PCB substrate. The integrated circuit device assembly 3000 illustrated in FIG. 30 includes a package-on-interposer structure 3036 coupled to the first face 3040 of the circuit board 3002 by coupling components 3016. The coupling components 3016 may electrically and mechanically couple the package-on-interposer structure 3036 to the circuit board 3002, and may include solder balls (as shown in FIG. 30), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 3036 may include an integrated circuit component 3020 coupled to an interposer 3004 by coupling components 3018. The coupling components 3018 may take any suitable form for the application, such as the forms discussed above with reference to the coupling components 3016. Although a single integrated circuit component 3020 is shown in FIG. 30, multiple integrated circuit components may be coupled to the interposer 3004; indeed, additional interposers may be coupled to the interposer 3004. The interposer 3004 may provide an intervening substrate used to bridge the circuit board 3002 and the integrated circuit component 3020.

The integrated circuit component 3020 may be a packaged or unpacked integrated circuit product that includes one or more integrated circuit dies (e.g., the die 2702 of FIG. 27, the integrated circuit device 2800 of FIG. 28) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 3020, a single monolithic integrated circuit die comprises solder bumps attached to contacts on the die. The solder bumps allow the die to be directly attached to the interposer 3004. The integrated circuit component 3020 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 3020 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 3020 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 3020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 3004 may spread connections to a wider pitch or reroute a connection to a different connection. For example, the interposer 3004 may couple the integrated circuit component 3020 to a set of ball grid array (BGA) conductive contacts of the coupling components 3016 for coupling to the circuit board 3002. In the embodiment illustrated in FIG. 30, the integrated circuit component 3020 and the circuit board 3002 are attached to opposing sides of the interposer 3004; in other embodiments, the integrated circuit component 3020 and the circuit board 3002 may be attached to a same side of the interposer 3004. In some embodiments, three or more components may be interconnected by way of the interposer 3004.

In some embodiments, the interposer 3004 may be formed as a PCB, including multiple metal layers separated from one another by layers of dielectric material and interconnected by electrically conductive vias. In some embodiments, the interposer 3004 may be formed of an epoxy resin, a fiberglass-reinforced epoxy resin, an epoxy resin with inorganic fillers, a ceramic material, or a polymer material such as polyimide. In some embodiments, the interposer 3004 may be formed of alternate rigid or flexible materials that may include the same materials described above for use in a semiconductor substrate, such as silicon, germanium, and other group III-V and group IV materials. The interposer 3004 may include metal interconnects 3008 and vias 3010, including but not limited to through hole vias 3010-1 (that extend from a first face 3050 of the interposer 3004 to a second face 3054 of the interposer 3004), blind vias 3010-2 (that extend from the first or second faces 3050 or 3054 of the interposer 3004 to an internal metal layer), and buried vias 3010-3 (that connect internal metal layers).

In some embodiments, the interposer 3004 can comprise a silicon interposer. Through silicon vias (TSV) extending through the silicon interposer can connect connections on a first face of a silicon interposer to an opposing second face of the silicon interposer. In some embodiments, an interposer 3004 comprising a silicon interposer can further comprise one or more routing layers to route connections on a first face of the interposer 3004 to an opposing second face of the interposer 3004.

The interposer 3004 may further include embedded devices 3014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 3004. The package-on-interposer structure 3036 may take the form of any of the package-on-interposer structures known in the art. In embodiments where the interposer is a non-printed circuit board The integrated circuit device assembly 3000 may include an integrated circuit component 3024 coupled to the first face 3040 of the circuit board 3002 by coupling components 3022. The coupling components 3022 may take the form of any of the embodiments discussed above with reference to the coupling components 3016, and the integrated circuit component 3024 may take the form of any of the embodiments discussed above with reference to the integrated circuit component 3020.

The integrated circuit device assembly 3000 illustrated in FIG. 30 includes a package-on-package structure 3034 coupled to the second face 3042 of the circuit board 3002 by coupling components 3028. The package-on-package structure 3034 may include an integrated circuit component 3026 and an integrated circuit component 3032 coupled together by coupling components 3030 such that the integrated circuit component 3026 is disposed between the circuit board 3002 and the integrated circuit component 3032. The coupling components 3028 and 3030 may take the form of any of the embodiments of the coupling components 3016 discussed above, and the integrated circuit components 3026 and 3032 may take the form of any of the embodiments of the integrated circuit component 3020 discussed above. The package-on-package structure 3034 may be configured in accordance with any of the package-on-package structures known in the art.

Figure 31:
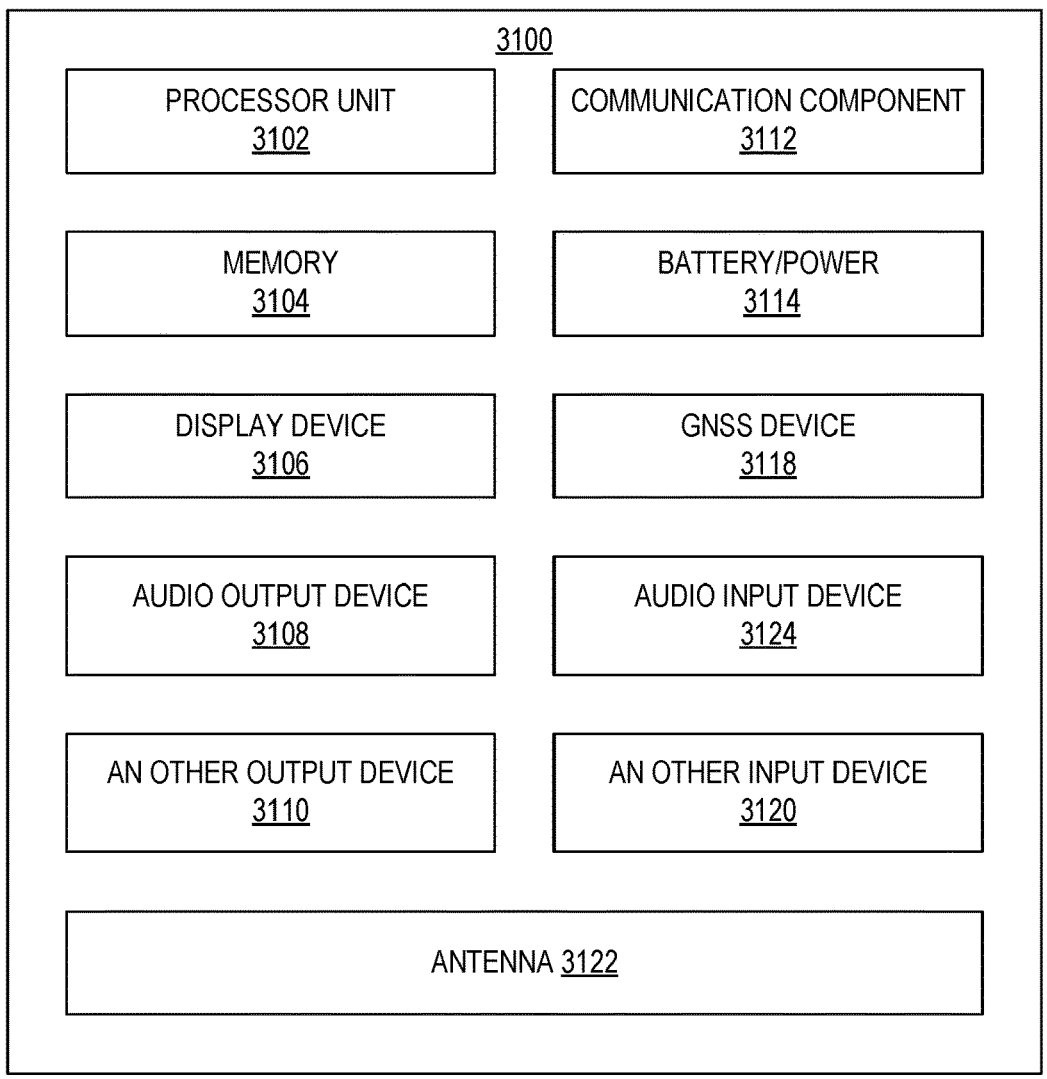
FIG. 31 is a block diagram of an example electrical device that may include a microelectronic assembly, in accordance with any of the embodiments disclosed herein.

FIG. 31 is a block diagram of an example electrical device 3100 that may include one or more of the conformal power delivery structures disclosed herein. For example, any suitable ones of the components of the electrical device 3100 may include one or more of the integrated circuit device assemblies 3000, integrated circuit components 3020, integrated circuit devices 2800, or integrated circuit dies 2702 disclosed herein. A number of components are illustrated in FIG. 31 as included in the electrical device 3100, but any one or more of these components may be omitted or duplicated, as suitable for the application. In some embodiments, some or all of the components included in the electrical device 3100 may be attached to one or more motherboards, mainboards, or system boards. In some embodiments, one or more of these components are fabricated onto a single system-on-a-chip (SoC) die.

Additionally, in various embodiments, the electrical device 3100 may not include one or more of the components illustrated in FIG. 31, but the electrical device 3100 may include interface circuitry for coupling to the one or more components. For example, the electrical device 3100 may not include a display device 3106, but may include display device interface circuitry (e.g., a connector and driver circuitry) to which a display device 3106 may be coupled. In another set of examples, the electrical device 3100 may not include an audio input device 3124 or an audio output device 3108, but may include audio input or output device interface circuitry (e.g., connectors and supporting circuitry) to which an audio input device 3124 or audio output device 3108 may be coupled.

The electrical device 3100 may include one or more processor units 3102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 3102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 3100 may include a memory 3104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 3104 may include memory that is located on the same integrated circuit die as the processor unit 3102. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 3100 can comprise one or more processor units 3102 that are heterogeneous or asymmetric to another processor unit 3102 in the electrical device 3100. There can be a variety of differences between the processing units 3102 in a system in terms of a spectrum of metrics of merit including architectural, microarchitectural, thermal, power consumption characteristics, and the like. These differences can effectively manifest themselves as asymmetry and heterogeneity among the processor units 3102 in the electrical device 3100.

In some embodiments, the electrical device 3100 may include a communication component 3112 (e.g., one or more communication components). For example, the communication component 3112 can manage wireless communications for the transfer of data to and from the electrical device 3100. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 3112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 3112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 3112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 3112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 3112 may operate in accordance with other wireless protocols in other embodiments. The electrical device 3100 may include an antenna 3122 to facilitate wireless communications and/or to receive other wireless communications (such as AM or FM radio transmissions).

In some embodiments, the communication component 3112 may manage wired communications, such as electrical, optical, or any other suitable communication protocols (e.g., IEEE 802.3 Ethernet standards). As noted above, the communication component 3112 may include multiple communication components. For instance, a first communication component 3112 may be dedicated to shorter-range wireless communications such as Wi-Fi or Bluetooth, and a second communication component 3112 may be dedicated to longer-range wireless communications such as global positioning system (GPS), EDGE, GPRS, CDMA, WiMAX, LTE, EV-DO, or others. In some embodiments, a first communication component 3112 may be dedicated to wireless communications, and a second communication component 3112 may be dedicated to wired communications.

The electrical device 3100 may include battery/power circuitry 3114. The battery/power circuitry 3114 may include one or more energy storage devices (e.g., batteries or capacitors) and/or circuitry for coupling components of the electrical device 3100 to an energy source separate from the electrical device 3100 (e.g., AC line power).

The electrical device 3100 may include a display device 3106 (or corresponding interface circuitry, as discussed above). The display device 3106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 3100 may include an audio output device 3108 (or corresponding interface circuitry, as discussed above). The audio output device 3108 may include any embedded or wired or wirelessly connected external device that generates an audible indicator, such as speakers, headsets, or earbuds.

The electrical device 3100 may include an audio input device 3124 (or corresponding interface circuitry, as discussed above). The audio input device 3124 may include any embedded or wired or wirelessly connected device that generates a signal representative of a sound, such as microphones, microphone arrays, or digital instruments (e.g., instruments having a musical instrument digital interface (MIDI) output). The electrical device 3100 may include a Global Navigation Satellite System (GNSS) device 3118 (or corresponding interface circuitry, as discussed above), such as a Global Positioning System (GPS) device. The GNSS device 3118 may be in communication with a satellite-based system and may determine a geolocation of the electrical device 3100 based on information received from one or more GNSS satellites, as known in the art.

The electrical device 3100 may include an other output device 3110 (or corresponding interface circuitry, as discussed above). Examples of the other output device 3110 may include an audio codec, a video codec, a printer, a wired or wireless transmitter for providing information to other devices, or an additional storage device.

The electrical device 3100 may include an other input device 3120 (or corresponding interface circuitry, as discussed above). Examples of the other input device 3120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 3100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 3100 may be any other electronic device that processes data. In some embodiments, the electrical device 3100 may comprise multiple discrete physical components. Given the range of devices that the electrical device 3100 can be manifested as in various embodiments, in some embodiments, the electrical device 3100 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes an integrated circuit component comprising a die; a conformal power delivery structure adjacent the die; one or more dielectric layers; and one or more signal traces, wherein individual signal traces of the one or more signal traces are spaced apart from the conformal power delivery structure by a dielectric layer of the one or more dielectric layers.

Example 2 includes the subject matter of Example 1, and wherein the conformal power delivery structure comprises a first electrically conductive layer comprising metal, the first electrically conductive layer defining one or more recesses; a second electrically conductive layer comprising metal, the second electrically conductive layer at least partially within the one or more recesses of the first electrically conductive layer and having a lower surface that generally conforms with an upper surface of the first electrically conductive layer; and a dielectric material between the surfaces of the first electrically conductive layer and the second electrically conductive layer that conform with one another.

Example 3 includes the subject matter of any of Examples 1 and 2, and further including one or more buffer layers, wherein individual buffer layers of the one or more buffer layers are between the second electrically conductive layer and individual dielectric layers of the one or more dielectric layers.

Example 4 includes the subject matter of any of Examples 1-3, and wherein individual buffer layers of the one or more buffer layers comprise titanium, tantalum, gold, or copper.

Example 5 includes the subject matter of any of Examples 1-4, and wherein the second electrically conductive layer comprises a plurality of grains separated by grain boundaries, wherein individual grains of the plurality of grains have a diameter between 10 and 100 micrometers.

Example 6 includes the subject matter of any of Examples 1-5, and wherein individual signal traces of the one or more signal traces are spaced at least 10 micrometers apart from the conformal power delivery structure by a dielectric layer of the one or more dielectric layers.

Example 7 includes the subject matter of any of Examples 1-6, and wherein the one or more signal traces are one or more high-speed signal traces.

Example 8 includes the subject matter of any of Examples 1-7, and wherein the one or more dielectric layers comprise polyimide.

Example 9 includes the subject matter of any of Examples 1-8, and wherein the one or more dielectric layers comprise one or more photoimageable dielectric layers.

Example 10 includes the subject matter of any of Examples 1-9, and wherein the integrated circuit component is a processor.

Example 11 includes a method comprising depositing a first power plane on a substrate; depositing one or more signal traces on the substrate; depositing one or more dielectric layers on the substrate; and depositing a second power plane on the substrate, wherein the second power plane is conformal to the first power plane, wherein individual signal traces of the one or more signal traces are spaced apart from the second power plane by a dielectric layer of the one or more dielectric layers.

Example 12 includes the subject matter of Example 11, and further including depositing a buffer stack around the first power plane and the one or more dielectric layers before depositing the second power plane.

Example 13 includes the subject matter of any of Examples 11 and 12, and wherein depositing the second power plane comprises depositing the second power plane using cold spray.

Example 14 includes the subject matter of any of Examples 11-13, and wherein the second power plane comprises a plurality of grains separated by grain boundaries, wherein individual grains of the plurality of grains have a diameter between 10 and 100 micrometers.

Example 15 includes the subject matter of any of Examples 11-14, and wherein the buffer stack comprises a second dielectric layer and a buffer layer.

Example 16 includes the subject matter of any of Examples 11-15, and wherein the second dielectric layer comprises (i) silicon and nitrogen, (ii) silicon, carbon, and nitrogen, (iv) titanium and oxygen, (v) hafnium and oxygen, (vi) silicon and oxygen, (vii) aluminum and nitrogen, or (viii) aluminum and oxygen.

Example 17 includes the subject matter of any of Examples 11-16, and wherein the buffer layer comprises titanium, tantalum, gold, or copper.

Example 18 includes the subject matter of any of Examples 11-17, and further including depositing one or more vias on the one or more signal traces.

Example 19 includes the subject matter of any of Examples 11-18, and wherein depositing the one or more vias comprises lithographically depositing the one or more vias.

Example 20 includes the subject matter of any of Examples 11-19, and wherein depositing the one or more vias comprises depositing the one or more vias by laser drilling.

Example 21 includes the subject matter of any of Examples 11-20, and wherein individual signal traces of the one or more signal traces are spaced at least 10 micrometers apart from the second power plane by a dielectric layer of the one or more dielectric layers.

Example 22 includes the subject matter of any of Examples 11-21, and wherein the one or more signal traces are one or more high-speed signal traces.

Example 23 includes the subject matter of any of Examples 11-22, and wherein the one or more dielectric layers comprise polyimide.

Example 24 includes the subject matter of any of Examples 11-23, and wherein the one or more dielectric layers comprise one or more photoimageable dielectric layers.

Example 25 includes an integrated circuit component comprising a conformal power delivery structure defined in a plane; and means for carrying high-speed signals in the plane defined by the conformal power delivery structure.

Example 26 includes the subject matter of Example 25, and wherein the means for carrying high-speed signals is less than 50 micrometers away from the conformal power delivery structure.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An integrated circuit component comprising:
   a die;
   a conformal power delivery structure adjacent the die; one or more dielectric layers; and
   one or more signal traces, wherein individual signal traces of the one or more signal traces are spaced apart from the conformal power delivery structure by a dielectric layer of the one or more dielectric layers,
   wherein the conformal power delivery structure comprises:
      a first electrically conductive layer comprising metal, the first electrically conductive layer defining one or more recesses, wherein a lower surface of the first electrically conductive layer defines a plane;
      a second electrically conductive layer comprising metal, the second electrically conductive layer at least partially within the one or more recesses of the first electrically conductive layer and having a lower surface that generally conforms with an upper surface of the first electrically conductive layer, wherein one or more parts of the second electrically conductive layer disposed within the one or more recesses of the first electrically conductive layer extend to the plane defined by the lower surface of the first electrically conductive layer; and
      a dielectric material between the surfaces of the first electrically conductive layer and the second electrically conductive layer that conform with one another.

2. The integrated circuit component of claim 1, further comprising one or more buffer layers, wherein individual buffer layers of the one or more buffer layers are between the second electrically conductive layer and individual dielectric layers of the one or more dielectric layers.

3. The integrated circuit component of claim 2, wherein the second electrically conductive layer comprises a plurality of grains separated by grain boundaries, wherein individual grains of the plurality of grains have a diameter between 10 and 100 micrometers, wherein the one or more parts of the second electrically conductive layer disposed within the one or more recesses of the first electrically conductive layer comprise the plurality of grains.

4. The integrated circuit component of claim 1, wherein individual signal traces of the one or more signal traces are spaced at least 10 micrometers apart from the conformal power delivery structure by a dielectric layer of the one or more dielectric layers.

5. The integrated circuit component of claim 1, wherein the one or more signal traces are one or more high-speed signal traces.

6. The integrated circuit component of claim 1, wherein the one or more dielectric layers comprise polyimide.

7. The integrated circuit component of claim 1, wherein the one or more dielectric layers comprise one or more photoimageable dielectric layers.

8. The integrated circuit component of claim 1, wherein the integrated circuit component is a processor.

9. The integrated circuit component of claim 1, wherein the one or more signal traces extend through the conformal power delivery structure.

10. The integrated circuit component of claim 1, wherein the dielectric material has a thickness that is less than a thickness of the one or more parts of the second electrically conductive layer disposed within the one or more recesses of the first electrically conductive layer.

11. The integrated circuit component of claim 1, wherein the one or more signal traces comprise differential signal pairs.

12. The integrated circuit component of claim 1, wherein the one or more dielectric layers comprise an organic material interspersed with silica particles.

13. The integrated circuit component of claim 1, wherein the conformal power delivery structure is formed using a cold spray deposition process.

14. The integrated circuit component of claim 1, wherein the first electrically conductive layer and the second electrically conductive layer each comprise copper.

15. The integrated circuit component of claim 1, wherein the one or more signal traces have a width between 50 micrometers and 150 micrometers.

16. The integrated circuit component of claim 1, wherein the one or more signal traces have a height between 5 micrometers and 40 micrometers.

17. The integrated circuit component of claim 1, wherein the one or more dielectric layers separate the one or more signal traces from the conformal power delivery structure by a distance between 10 micrometers and 200 micrometers.

18. An integrated circuit component comprising:
   a die;
   a conformal power delivery structure adjacent the die; one or more dielectric layers; and
   one or more signal traces, wherein individual signal traces of the one or more signal traces are spaced apart from the conformal power delivery structure by a dielectric layer of the one or more dielectric layers,
   wherein the conformal power delivery structure comprises:
      a first electrically conductive layer comprising metal, the first electrically conductive layer defining one or more recesses;
      a second electrically conductive layer comprising metal, the second electrically conductive layer at least partially within the one or more recesses of the first electrically conductive layer and having a lower surface that generally conforms with an upper surface of the first electrically conductive layer; and a dielectric material between the surfaces of the first electrically conductive layer and the second electrically conductive layer that conform with one another, further comprising one or more buffer layers, wherein individual buffer layers of the one or more buffer layers are between the second electrically conductive layer and individual dielectric layers of the one or more dielectric layers, wherein individual buffer layers of the one or more buffer layers comprise titanium, tantalum, gold, or copper.

19. An integrated circuit component comprising:

a conformal power delivery structure defined in a plane; and one or more high-speed signal traces in the plane defined by the conformal power delivery structure, wherein the one or more high-speed signal traces extend through the conformal power delivery structure.

20. The integrated circuit component of claim 19, wherein the one or more high-speed signal traces are less than 50 micrometers away from the conformal power delivery structure.

21. The integrated circuit component of claim 19, wherein the conformal power delivery structure comprises a first power plane and a second power plane separated by a dielectric material.

22. The integrated circuit component of claim 19, wherein the one or more high-speed signal traces are spaced apart from the conformal power delivery structure by a dielectric layer.

23. The integrated circuit component of claim 19, wherein the conformal power delivery structure comprises a buffer stack including a dielectric layer and a buffer layer.

24. The integrated circuit component of claim 19, wherein the conformal power delivery structure is formed using a high throughput additive manufacturing process.

* * * * *